United States Patent
Tanaka et al.

(10) Patent No.: US 10,082,542 B2
(45) Date of Patent: Sep. 25, 2018

(54) BATTERY STATE DETECTION APPARATUS AND METHOD FOR MANUFACTURING SAME

(71) Applicants: FURUKAWA ELECTRIC CO., LTD., Tokyo (JP); FURUKAWA AUTOMOTIVE SYSTEMS INC., Shiga (JP)

(72) Inventors: Kazuyuki Tanaka, Shiga (JP); Haruhiko Takeuchi, Shiga (JP); Kengo Aburaya, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 254 days.

(21) Appl. No.: 14/900,119

(22) PCT Filed: May 28, 2014

(86) PCT No.: PCT/JP2014/002818
§ 371 (c)(1),
(2) Date: Dec. 18, 2015

(87) PCT Pub. No.: WO2014/203465
PCT Pub. Date: Dec. 24, 2014

(65) Prior Publication Data
US 2016/0139209 A1   May 19, 2016

(30) Foreign Application Priority Data

Jun. 20, 2013 (JP) ................................. 2013-129728
Jun. 20, 2013 (JP) ................................. 2013-129732

(51) Int. Cl.
G01R 31/36 (2006.01)
H01M 10/48 (2006.01)
(Continued)

(52) U.S. Cl.
CPC .......... *G01R 31/3644* (2013.01); *B23K 20/10* (2013.01); *B29C 65/08* (2013.01);
(Continued)

(58) Field of Classification Search
CPC   G01R 31/3644; H01M 10/4285; B23K 20/10
(Continued)

(56) References Cited

U.S. PATENT DOCUMENTS

2007/0200720 A1* 8/2007 Dreiskemper ......... G01R 1/203
340/636.1
2007/0244471 A1* 10/2007 Malackowski ....... H01M 10/42
606/1
(Continued)

FOREIGN PATENT DOCUMENTS

DE    202008017318 U1   6/2009
EP    1807708 A1    7/2007
(Continued)

OTHER PUBLICATIONS

Extended European Search Report dated May 4, 2017 for European Patent Application No. 14814246.6, 13 pages.
(Continued)

*Primary Examiner* — Nathaniel Pelton
(74) *Attorney, Agent, or Firm* — Amin, Turocy & Watson, LLP

(57) ABSTRACT

A battery state detection device includes a casing (8) and a lid part (24). The casing (8) includes a board storage space (23) that stores a circuit board. The casing (8) includes an open mouth through which one side of the board storage space (23) is opened. The lid part (24) closes the open mouth of the casing (8). The lid part (24) is provided with a tapered surface (77). The casing (8) is provided with a contact portion (78) that can be in contact with the tapered surface (77). In a state where the tapered surface (77) and the contact
(Continued)

portion (78) are in contact with each other, ultrasonic welding between the casing (8) and the lid part (24) is performed.

12 Claims, 17 Drawing Sheets

(51) Int. Cl.
    *B23K 20/10*     (2006.01)
    *H01M 10/42*     (2006.01)
    *B29C 65/08*     (2006.01)
    *G01R 1/20*     (2006.01)
    *B29C 65/00*     (2006.01)
    *G01R 1/04*     (2006.01)

(52) U.S. Cl.
    CPC .... *B29C 66/1286* (2013.01); *B29C 66/12821* (2013.01); *B29C 66/12841* (2013.01); *B29C 66/3022* (2013.01); *B29C 66/322* (2013.01); *B29C 66/542* (2013.01); *B29C 66/73921* (2013.01); *B29C 66/8322* (2013.01); *G01R 1/203* (2013.01); *G01R 31/3696* (2013.01); *H01M 10/4285* (2013.01); *H01M 10/48* (2013.01); *G01R 1/04* (2013.01); *H01M 2220/20* (2013.01)

(58) Field of Classification Search
    USPC .......................................................... 324/426
    See application file for complete search history.

(56) References Cited

U.S. PATENT DOCUMENTS

| 2008/0050960 A1* | 2/2008 | Koelle | G01R 1/203 |
| | | | 439/345 |
| 2008/0078712 A1* | 4/2008 | Enokida | B01D 29/111 |
| | | | 210/167.02 |
| 2010/0297478 A1* | 11/2010 | Mashiko | H01M 2/043 |
| | | | 429/7 |
| 2011/0050240 A1 | 3/2011 | Nentwig et al. | |
| 2014/0015636 A1 | 1/2014 | Tanaka et al. | |

FOREIGN PATENT DOCUMENTS

| EP | 1890162 B1 | 3/2015 |
| JP | H0739274 Y2 | 9/1995 |
| JP | 09068343 A | 3/1997 |
| JP | 2008082257 A | 4/2008 |
| JP | 2011117853 A | 6/2011 |
| JP | 2011210610 A | 10/2011 |
| JP | 2012075277 A | 4/2012 |
| JP | 2012215452 A | 11/2012 |
| WO | 2008016152 A1 | 2/2008 |

OTHER PUBLICATIONS

International Search Report dated Aug. 12, 2014 for PCT Application Serial No. PCT/JP2014/002818, 6 pages.
Partial Supplementary European Search Report dated Jan. 31, 2017 for European Patent Application No. 14814246.6, 10 pages.

* cited by examiner

Fig.18
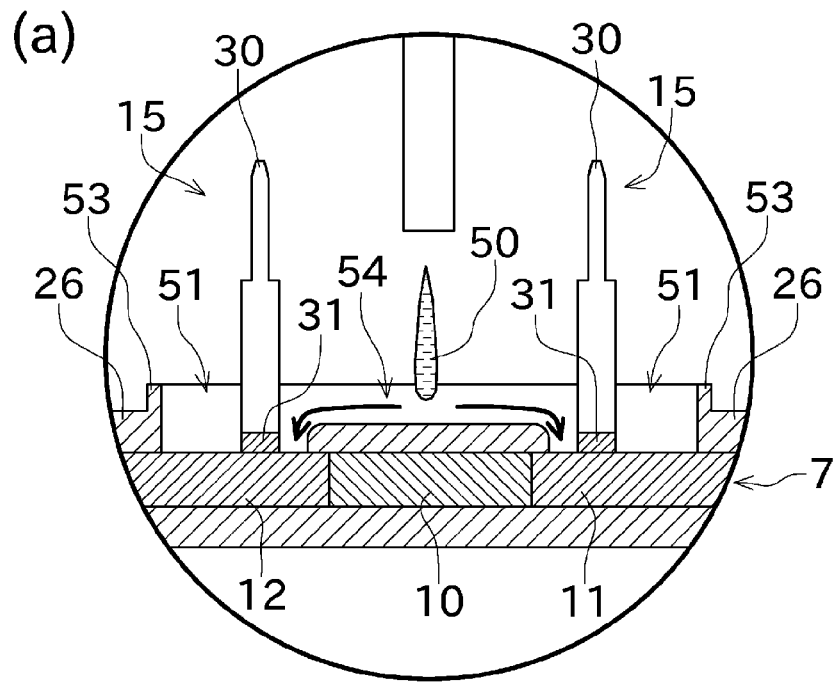
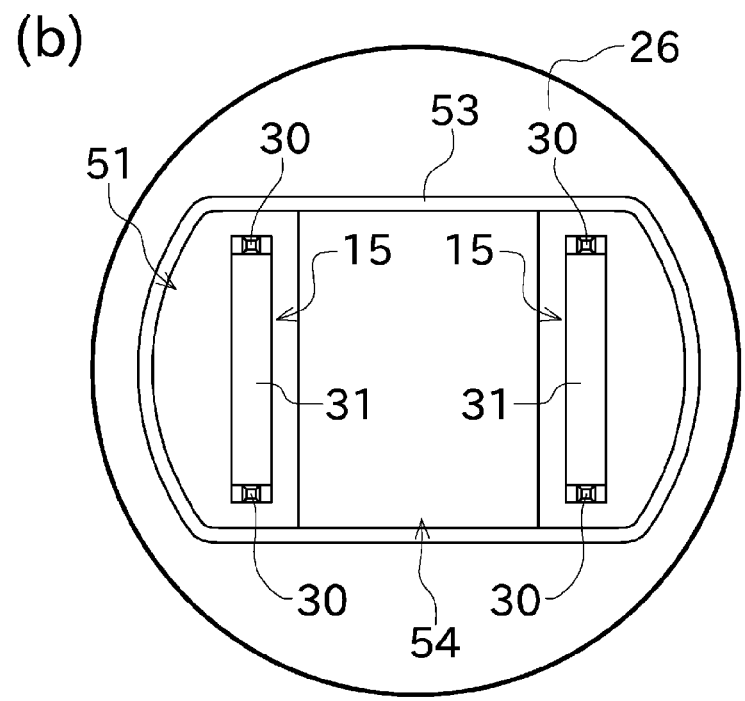

BATTERY STATE DETECTION APPARATUS AND METHOD FOR MANUFACTURING SAME

CROSS-REFERENCE TO RELATED APPLICATION

The subject application is a U.S. National Stage Application under 35 U.S.C. § 371 of patent cooperation treaty (PCT) Patent Application No. PCT/JP2014/002818, filed May 28, 2014, and entitled "BATTERY STATE DETECTION APPARATUS AND METHOD FOR MANUFACTURING SAME", which claims priority to Japanese Patent Application Serial No. 2013-129732, filed June 20, 2013 and to Japanese Patent Application Serial No. 2013-129728, filed June 20, 2013, the disclosures of each of which applications are incorporated herein by reference in their entireties.

TECHNICAL FIELD

The present invention relates to a battery state detection device, and in particular, to a configuration for improving the waterproofness of a casing thereof.

BACKGROUND ART

Conventionally known is a battery state detection device (battery sensor) that detects the state of a battery. Such battery state detection devices are disclosed in, for example, Patent Documents 1 and 2.

The battery state detection device of this type includes a shunt resistor used for detection of a current, a circuit board, and the like. The battery state detection device may include a casing that houses the shunt resistor and the circuit board.

The casing, for example, has a box-like shape made of plastic. A board storage space for storing the shunt resistor, the circuit board, and the like, is formed in the casing. The casing is configured such that a lid part for closing an open end of the storage space can be mounted to the casing. The lid part is mounted in a state where the shunt resistor, the circuit board, and the like, are housed in the casing, thus achieving in hermetic sealing of the casing.

Particularly in the field of vehicles, it is demanded that a battery state detection device have a high reliability, mainly from the viewpoint of safety. For example, entry of water into the casing of the battery state detection device may cause malfunction or failure because of the water adhering to the circuit board or the like. This is why a high degree of hermetic sealing (waterproofness) is demanded of the casing of the battery state detection device.

In this respect, the conventional battery state detection device has an O-ring arranged between a casing and a lid part, to ensure the hermetic sealing of the casing.

PRIOR-ART DOCUMENTS

Patent Documents

Patent Document 1: Japanese Patent Application Laid-Open No. 2011-210610
Patent Document 2: Japanese Patent Application Laid-Open No. 2012-215452

SUMMARY OF THE INVENTION

Problems to be Solved by the Invention

The O-ring, however, involves an aging problem, and therefore a configuration using the O-ring could not be considered as capable of maintaining good hermetic sealing of the casing for a long period of time.

The present invention has been made in view of the circumstances described above, and an object of the present invention is to provide a battery state detection device having a high reliability and able to maintain hermetic sealing of a casing for a long period of time.

Means for Solving the Problems and Effects Thereof

Problems to be solved by the present invention are as described above, and next, means for solving the problems and effects thereof will be described.

In an aspect of the invention of the present application, a battery state detection device having the following configuration is provided. The battery state detection device includes a circuit board, a casing, and a lid part. The circuit board detects a current. The casing includes a board storage space that stores the circuit board. The casing includes an open mouth through which one side of the board storage space is opened. The lid part closes the open mouth of the casing. A welded portion in which the casing and the lid part are connected to each other by welding is formed along an edge portion of the open mouth.

Welding the casing and the lid part to each other along the edge portion of the open mouth of the casing can ensure hermetic sealing of the casing without using an O-ring.

Preferably, the battery state detection device is configured as follows. The casing has a first wall surface arranged inside the welded portion. The lid part has a second wall surface arranged inside the welded portion. The second wall surface is opposed to the first wall surface. An in-casing burr storage space is provided between the first wall surface and the second wall surface. The in-casing burr storage space is in communication with the welded portion.

At a time of welding the casing and the lid part to each other, a burr (welding dust) is generated. Providing the burr storage space inside the welded portion can store the burr therein so that the burr is prevented from overflowing to the board storage space side.

In the battery state detection device, it is preferable that the casing or the lid part is provided with a burr receiver that is opposed to an end portion of the in-casing burr storage space.

Providing the burr receiver in this manner enables the burr generated in welding to be trapped in the burr storage space. This can prevent the burr from scattering in the storage space.

Preferably, the battery state detection device is configured as follows. The lid part has a third wall surface arranged outside the welded portion. The casing has a fourth wall surface arranged outside the welded portion. The fourth wall surface is opposed to the third wall surface. An out-of-casing burr storage space is provided between the third wall surface and the fourth wall surface. The out-of-casing burr storage space is in communication with the welded portion.

The burr generated at a time of welding the casing and the lid part to each other flies outward of the casing, too. The burr, if left untreated, spoils the appearance of the casing. Therefore, the burr storage space is also arranged outside the welded portion. This can prevent the burr from overflowing to the outside, thus preventing the appearance of the casing from being spoiled.

Preferably, the battery state detection device is configured as follows. The battery state detection device includes a shunt resistor. The circuit board detects a current having flowed through the shunt resistor. The storage space of the casing stores the circuit board. A plurality of anti-rattling pins are provided in the storage space of the casing. Each of the anti-rattling pins includes a tapered portion and a plurality of crash ribs. The tapered portion has a tapered shape, and is formed at the distal end of the anti-rattling pin. Each of the crash ribs has a rib-like shape starting from a position located at a proximal side relative to the tapered portion and extending in a longitudinal direction of the anti-rattling pin. Each of the crash ribs has a tapered shape that flares out toward the proximal side of the anti-rattling pin. The circuit board has a reception hole that receives the anti-rattling pin.

Since the distal end of the anti-rattling pin has a tapered shape as described above, the anti-rattling pin can be easily inserted into the reception hole of the circuit board. The tapered crash ribs bite into the reception hole of the circuit board, and thereby the position of the circuit board is settled in a plane perpendicular to the longitudinal direction of the anti-rattling pin, so that rattling of the circuit board is prevented.

Preferably, the battery state detection device is configured as follows. The anti-rattling pins include a position settlement pin and a rotation restriction pin. The circuit board has a position settlement hole that receives the position settlement pin and a rotation restriction hole that receives the rotation restriction pin. The rotation restriction hole is an elongated hole elongated along a straight line connecting the rotation restriction hole to the position settlement hole.

Since the rotation restriction hole is an elongated hole, tolerances of the dimension between the position settlement pin and the rotation restriction pin can be absorbed.

In the battery state detection device, it is preferable that a plurality of board fixing ribs are provided on a wall surface of the casing. The plurality of board fixing ribs come into contact with the circuit board. The contact occurs from the proximal side of the anti-rattling pin.

Providing the board fixing ribs in this manner can suppress rattling of the circuit board in the longitudinal direction of the anti-rattling pin.

Preferably, the battery state detection device is configured as follows. An anti-warp rib is provided on the wall surface of the casing. The anti-warp rib is arranged between the board fixing ribs. With respect to the longitudinal direction of the anti-rattling pin, a distal end portion of the anti-warp rib is positioned closer to the proximal side than a distal end portion of each of the board fixing ribs is.

Providing the anti-warp rib on the wall surface of the casing in this manner makes the wall surface less likely to deform. Thus, warping of the wall surface, or the like, during formation of the wall surface can be prevented. The anti-warp rib is a rib intended for reinforcement and it is independent of prevention of rattling of the circuit board. Therefore, the anti-warp rib is formed at a position lower than the board fixing rib as described above, in order to avoid contact with the circuit board.

Preferably, the battery state detection device is configured as follows. The battery state detection device includes a board connection terminal that connects the shunt resistor to the circuit board. The casing is provided with a partition wall that separates the storage space and the shunt resistor from each other. The partition wall has a terminal pass-through hole that allows the board connection terminal to pass therethrough. The terminal pass-through hole is filled with a sealant.

By providing the partition wall that separates the storage space and the shunt resistor from each other and additionally filling the terminal pass-through hole with the sealant, entry of water into the storage space from the shunt resistor side can be prevented. Since it suffices that only the terminal pass-through hole is filled with the sealant, the amount of sealant consumed can be considerably reduced as compared with the conventional configuration in which the storage space is filled with the sealant, while a degree of waterproofness comparable to that of the conventional configuration can be obtained.

Preferably, the battery state detection device is configured as follows. A filling amount checker in the form of a recess is provided in the partition wall. The filling amount checker is in communication with the terminal pass-through hole. The filling amount checker has a depth less than the depth of the terminal pass-through hole.

In this configuration, when the terminal pass-through hole is filled with the sealant to a certain extent, the sealant overflows therefrom and flows into the filling amount checker. Accordingly, based on determination by visual observation (or by detection using an appropriate detection device) that the sealant has flowed into the filling amount checker, it can be determined that the terminal pass-through hole is filled with a predetermined amount or more of the sealant. This ensures that the terminal pass-through hole is filled with a required amount of the sealant.

In the battery state detection device, it is preferable that an edge portion of the terminal pass-through hole has a beveled contour.

The edge portion of the terminal pass-through hole having such a rounded-off contour facilitates flowing of the sealant injected into the terminal pass-through hole. Accordingly, the terminal pass-through hole can be filled with the sealant without fail.

In another aspect of the present invention, a method for manufacturing a battery state detection device is provided as follows. The battery state detection device includes a circuit board, a casing, and a lid part. The circuit board detects a current. The casing includes a board storage space that stores the circuit board. The casing includes an open mouth through which one side of the board storage space is opened. The lid part closes the open mouth of the casing. One of the casing and the lid part is provided with a tapered surface. The other of the casing and the lid part is provided with a contact portion that is brought into contact with the tapered surface. The manufacturing method includes a welding step of performing ultrasonic welding between the casing and the lid part in a state where the tapered surface and the contact portion are in contact with each other.

Since the welding is performed with the tapered surface is in contact, the tapered surface guides the lid part and the casing during the welding, so that their relative positions are settled naturally. This enables the welding to be performed with a high accuracy, thus achieving the casing and the lid part structured with a high reliability.

In the manufacturing method, it is preferable that, in the welding step, the ultrasonic welding is performed with an anti-deformation jig arranged along an outer peripheral wall surface of the casing.

In the invention of the present application, the welding is performed with the tapered surface in contact. Therefore, during the welding, the casing receives a force that causes the casing to deform so as to flare outward. This, conversely, means that the casing does not deform inward. Accordingly, arranging the anti-deformation jig so as to prevent the casing from flaring outward can prevent deformation of the casing. This enables the welding to be performed with a high accuracy, thus achieving the casing and the lid part structured with a high reliability.

Preferably, the manufacturing method is implemented as follows. The contact portion is provided in the casing. The casing has a first wall surface facing inward. The first wall surface is arranged inside the contact portion. The tapered surface is provided in the lid part. The lid part has a second wall surface facing outward. The second wall surface is arranged inside the tapered surface. In the welding step, a predetermined gap is formed between the first wall surface and the second wall surface in the state where the tapered surface and the contact portion are in contact with each other.

Since a predetermined gap is formed between the first wall surface and the second wall surface, the burr generated in the welding step can be stored in the gap.

BRIEF DESCRIPTION OF THE DRAWINGS

FIG. 18 (a) is a front cross-sectional view showing, on an enlarged scale, terminal pass-through holes and therearound according to a variation; and (b) is a plan view showing the terminal pass-through holes according to the variation.

EMBODIMENT FOR CARRYING OUT THE INVENTION

Figure 1:
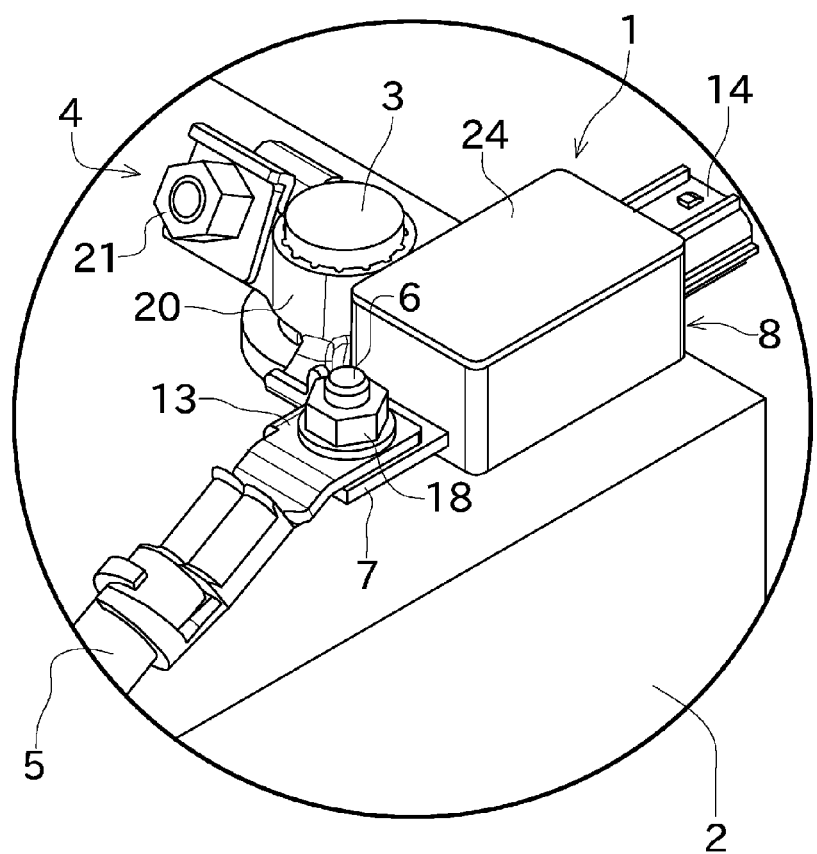
FIG. 1 A perspective view showing a battery state detection device in use according to an embodiment of the present invention.

An embodiment of the present invention will be described with reference to the drawings. As shown in FIG. 1, a battery state detection device 1 of this embodiment includes a battery post terminal 4 for connection to a battery post 3 included in a battery 2, a harness connecting part 6 for connection to a harness 5 that is connected to a load (not shown), and a casing 8.

Figure 2:
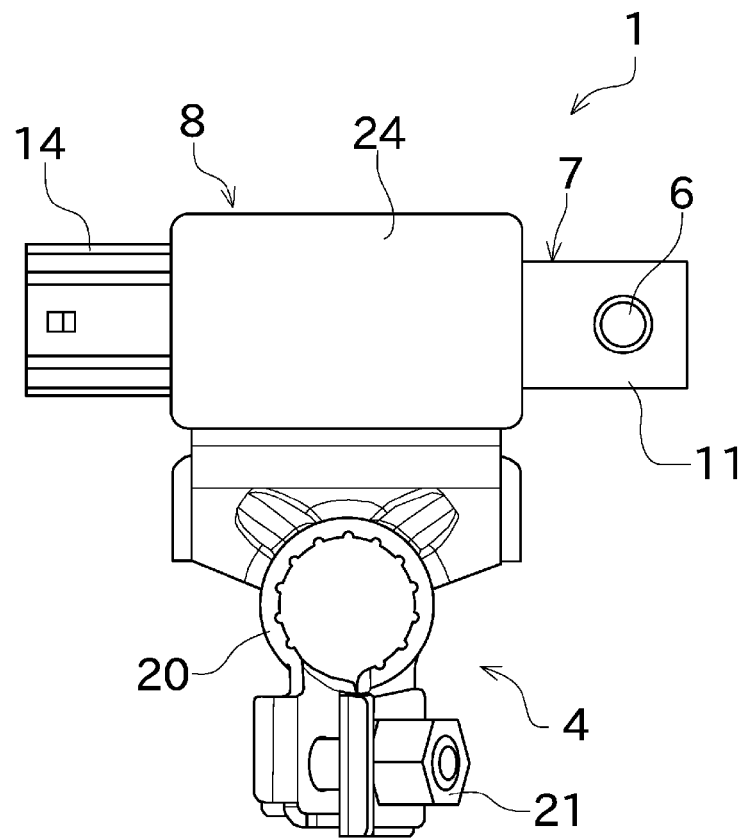
FIG. 2 A plan view of the battery state detection device.

The battery post terminal 4 is formed of a metal plate through a stamping or bending process. Referring to FIGS. 1 and 2, the battery post terminal 4 includes a battery post connecting part 20 for connection to the battery post 3 of the battery 2. The battery post connecting part 20 has a substantially tube-like shape. Under a state where this tube-like portion receives the battery post 3 therein, a tightening bolt 21 is tightened, so that the tube-like portion bite into a peripheral surface of the battery post 3. As a result, the battery post connecting part 20 is (electrically and mechanically) connected to the battery post 3.

Figure 3:
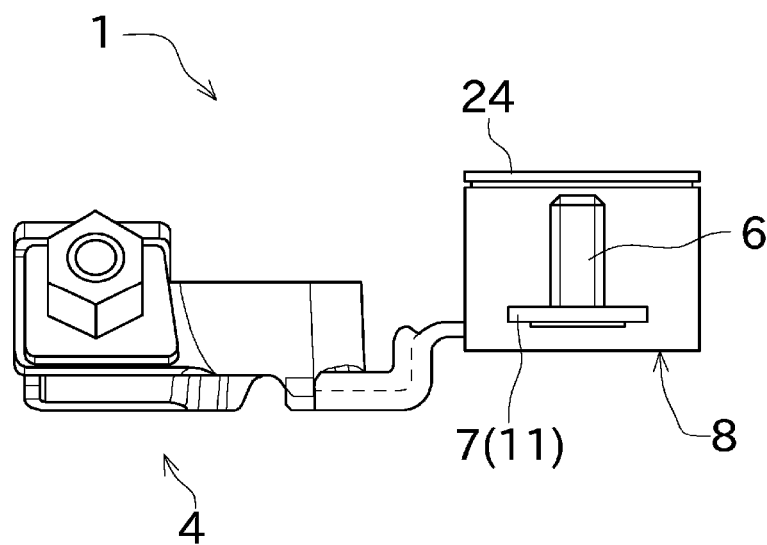
FIG. 3 A side view of the battery state detection device.

As shown in FIG. 3, etc., the harness connecting part 6 is configured as a bolt (stud bolt). The harness 5 has, in its end portion, a terminal 13 (FIG. 1). As shown in FIG. 1, the harness connecting part 6 is received through the terminal 13, and additionally a nut 18 is tightened to the harness connecting part 6, which results in (electrical and mechanical) connection of the harness 5 to the harness connecting part 6.

Figure 4:
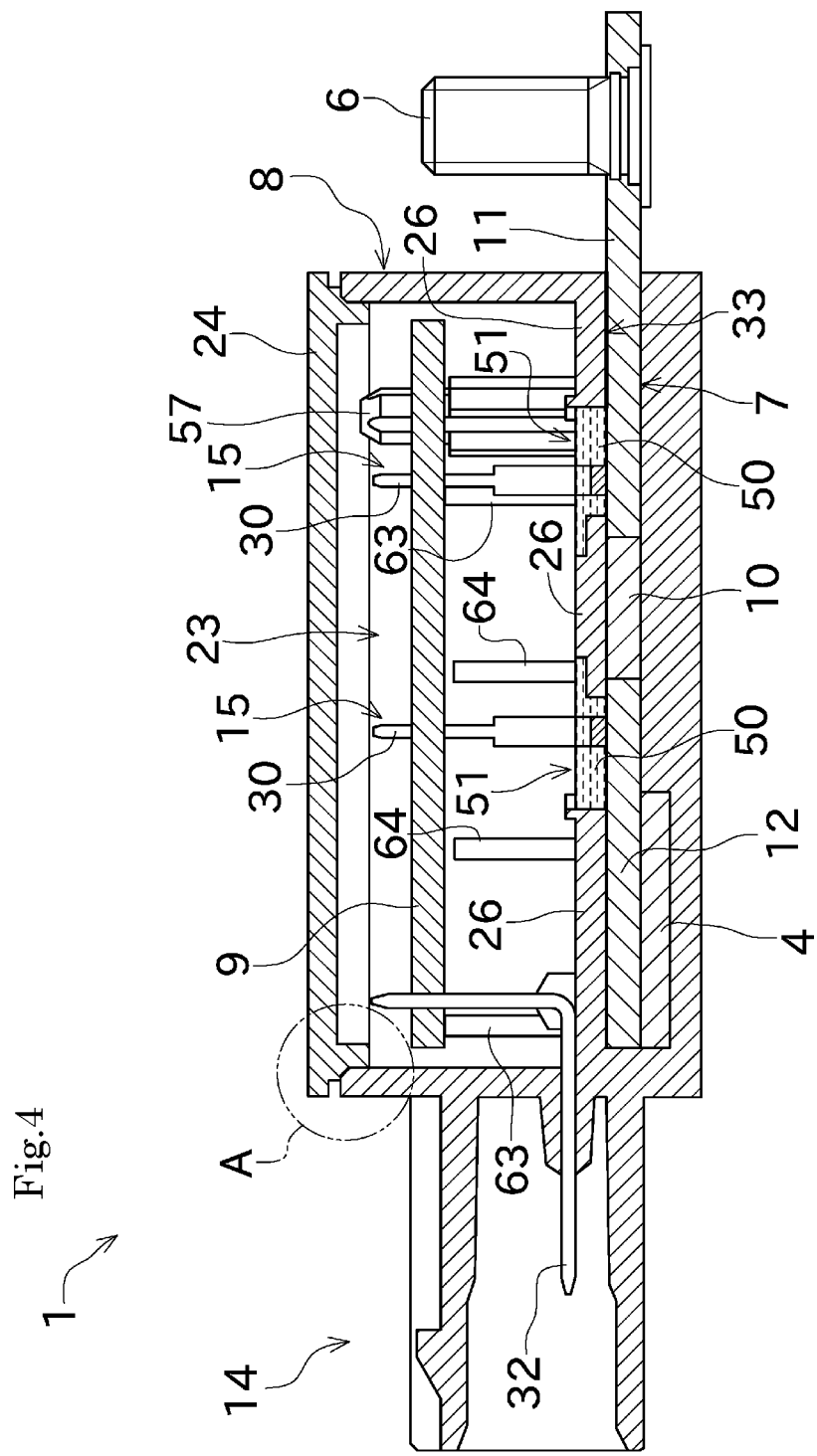
FIG. 4 A front cross-sectional view showing the battery state detection device.

Next, the inside of the casing 8 will be described. The casing 8 is made of a resin, and in the shape of a substantially parallelepiped box. As shown in FIG. 4, a board storage space 23 for storing a circuit board 9 and the like is formed in the casing 8.

Figure 5:
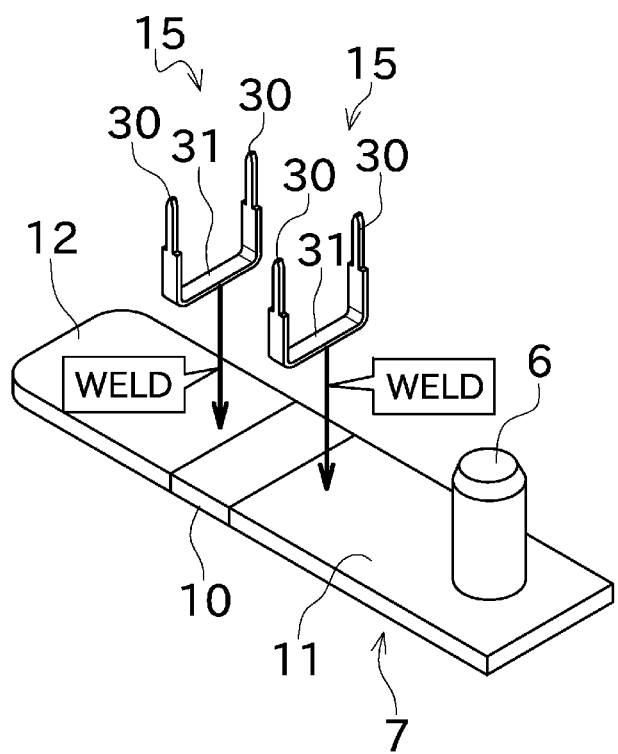
FIG. 5 A perspective view showing a situation where board connection terminals are mounted to a shunt resistor.

As shown in FIG. 4, a part of a shunt resistor 7 illustrated in FIG. 5 and a part of the battery post terminal 4 are arranged in the casing 8. A partition wall 26 that separates the board storage space 23 and the shunt resistor 7 from each other is provided in the casing 8.

As shown in FIGS. 4 and 5, the shunt resistor 7 is configured such that a resistor element 10 (e.g., Manganin) whose resistance value is known is arranged between a first conductor part 11 and a second conductor part 12. A portion of the first conductor part 11, the second conductor part 12, and the resistor element 10 are arranged within the casing 8. Referring to FIG. 4, the first conductor part 11 is arranged so as to partially protrude out of the casing 8. The harness connecting part 6 is provided on this protruding portion. The battery post terminal 4 is connected to the second conductor part 12 of the shunt resistor 7.

Figure 6:
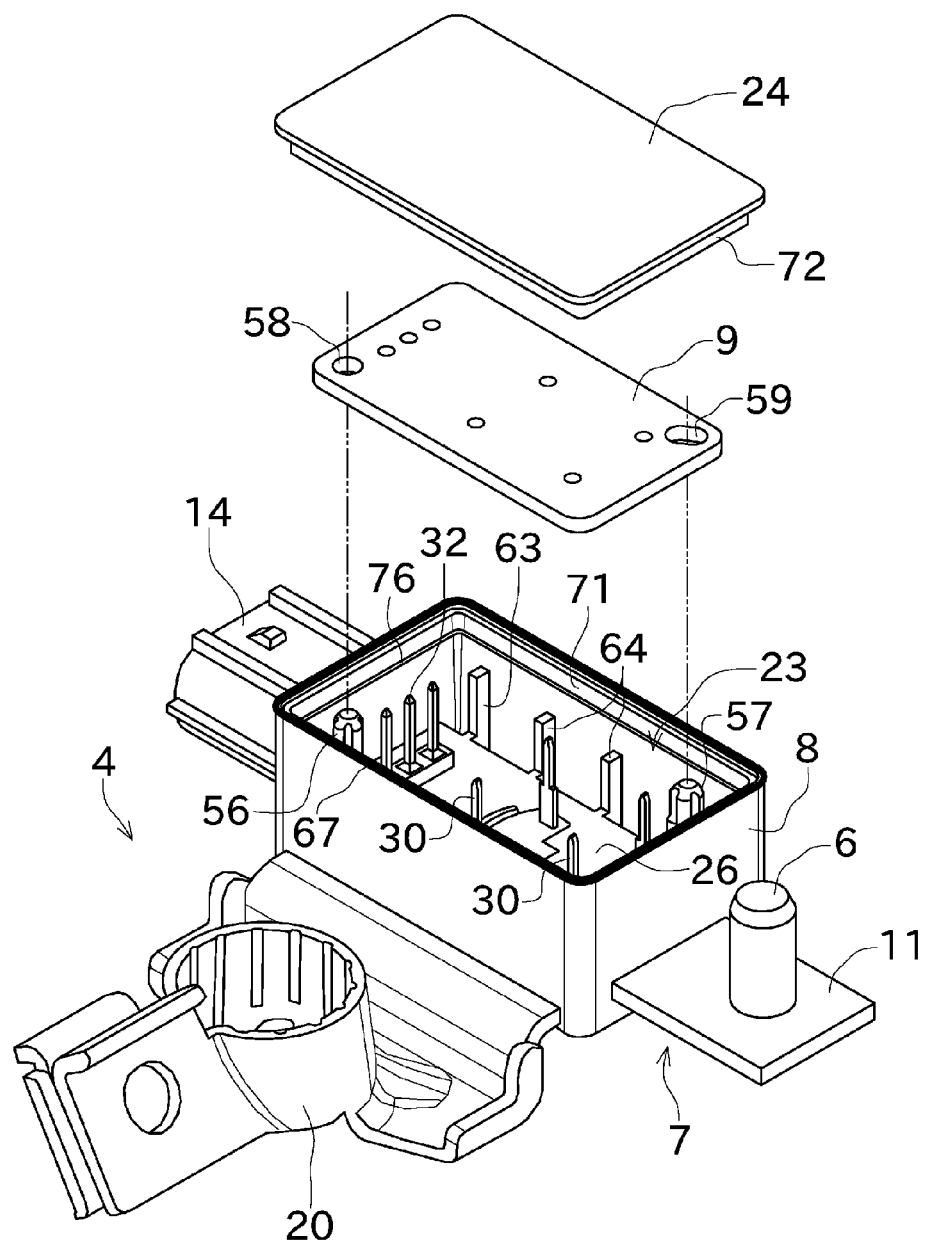
FIG. 6 A perspective view showing assembling of the battery state detection device.

As shown in FIG. 6, the casing 8 has an open mouth 67 through which one side of the board storage space 23 is opened. Since one side of the board storage space 23 is opened, the circuit board 9 and the like can be assembled into the board storage space 23, as illustrated in the perspective view of FIG. 6 which shows assembling. In the descriptions given below, an outer edge contour of an end surface of the open mouth 67 of the casing 8 may be referred to as "edge portion of the open mouth 67" or simply as "edge portion". In this embodiment, to be specific, the "edge portion of the open mouth 67" means a portion indicated by the bold line in FIG. 6. Since the casing 8 of this embodiment is in the shape of a substantially parallelepiped box, the edge portion of the open mouth 67 has a substantially rectangular shape.

Furthermore, the casing 8 is provided with a lid part 24 for closing the open mouth 67. Similarly to the casing 8, the lid part 24 is made of a resin.

As shown in FIGS. 4 and 5, each of the first conductor part 11 and the second conductor part 12 of the shunt resistor 7 is provided with one board connection terminal 15. As shown in FIG. 5, the board connection terminal 15 of this embodiment is formed of a metal member in the shape of an elongated plate being bent into substantially U-like shape (or C-like shape). The board connection terminal 15 has two connecting parts 30 whose proximal end portions are connected via a middle portion 31.

In this embodiment, a structure for mounting the board connection terminals 15 to the shunt resistor 7 is different from conventional one. In a conventional battery state detection device, a board connection terminal and a shunt resistor are fastened with a mounting screw, though not shown, to mount the board connection terminal to the shunt resistor. In the battery state detection device 1 of this embodiment, on the other hand, the board connection terminal 15 is mounted to the shunt resistor 7 by welding. More specifically, as shown in FIG. 5, the middle portion 31 of the board connection terminal 15 is welded to the shunt resistor 7, and thereby the board connection terminal 15 is (electrically and mechanically) connected to the shunt resistor 7. This configuration can eliminate the need of the mounting screw which has been conventionally required for mounting the board connection terminal 15.

Each board connection terminal 15 (and more specifically each connecting part 30 of the board connection terminal 15) is appropriately connected to an electronic circuit mounted on the circuit board 9. Thus, the shunt resistor 7 is electrically connected to the electronic circuit provided on the circuit board 9. For the connection of the shunt resistor 7 to the circuit board 9, it is necessary that the board connection terminal 15 is arranged to straddle opposite sides of the partition wall 26. This is why the partition wall 26 has terminal pass-through holes 51 that allow the board connection terminals 15 to pass therethrough.

The circuit board 9 is configured to apply pulse discharge via the board connection terminals 15 and to detect, for example, the intensity of a current having flowed through the resistor element 10 via the board connection terminals 15. The casing 8 includes a connector 14 (see FIGS. 1 and 4) that outputs a result of the detection. The circuit board 9 is connected to an output terminal 32 (FIG. 4) provided in the connector 14, and configured to output a result of the detection through the output terminal 32. Another external device (for example, an engine control unit (ECU) of an automobile) connected to the connector 14 is able to determine the battery state based on the result of the detection outputted from the connector 14. Since a method for determining the battery state based on a detection result obtained through pulse discharge or the like is known, a detailed description thereof is omitted.

Next, a first characteristic configuration of this embodiment will be described.

One of the features of the battery state detection device 1 of this embodiment is that an O-ring that has been provided between the casing and the lid part of the conventional battery state detection device is eliminated and the casing 8 is connected to the lid part 24 by means of ultrasonic welding. Such integration of the casing 8 and the lid part 24 by welding improves the hermetic sealing of the casing 8, thus achieving a high degree of waterproofness. Moreover, the aging problem of the O-ring is not caused. Accordingly, the battery state detection device 1 of this embodiment is able to maintain good hermetic sealing of the casing 8 for a long period of time.

Figure 7:
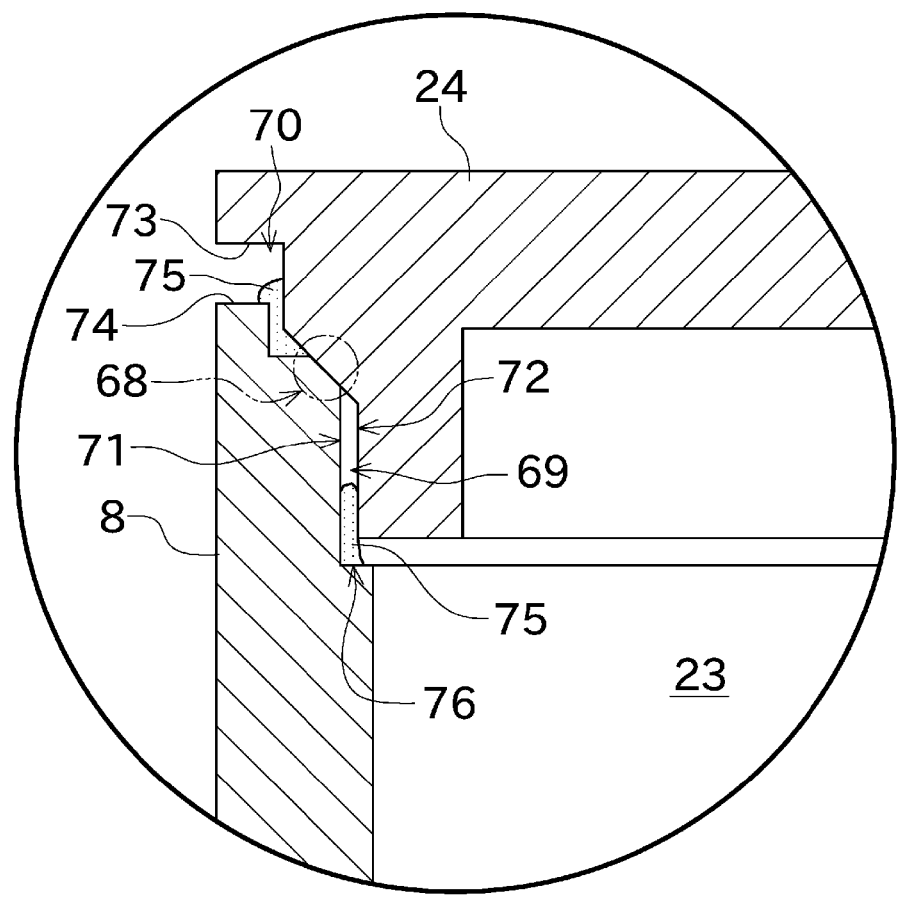
FIG. 7 A cross-sectional view showing, on an enlarged scale, an area A indicated in FIG. 4.

Next, with reference to FIG. 7, a structure of a part where the casing 8 and the lid part 24 are connected to each other will be described in detail. FIG. 7 shows an area A of FIG. 4 on an enlarged scale.

In this embodiment, as mentioned above, the casing 8 and the lid part 24 are connected to each other by welding. A portion where they are connected to each other is illustrated as a welded portion 68 in FIG. 7. In this embodiment, from the viewpoint of improving adhesion of the casing 8 and the lid part 24 to each other, they are made of the same resin material. Here, it is pointed out that an interface between the casing 8 and the lid part 24 in the welded portion 68 is shown in FIG. 7 for convenience of the illustration, but in actuality such a clear interface may not always exist in the welded portion 68. Welding the casing 8 and the lid part 24 to each other can completely integrate them in the welded portion 68.

The welded portion 68 is formed so as to extend along an entire circumference of the edge portion of the open mouth 67 (FIG. 6) of the casing 8. That is, the open mouth 67 of the casing 8 is sealed over the entire circumference thereof by the welded portion 68. As a result, a gap between the casing 8 and the lid part 24 is completely closed, so that the hermetic sealing of the casing 8 is ensured.

As shown in FIG. 7, the casing 8 has a first wall surface 71 facing inward and arranged inside the welded portion 68. The lid part 24 has a second wall surface 72 facing outward and opposed to the first wall surface 71. In the present description, "in" or "out" is based on the inside or outside of the casing 8.

As shown in FIG. 6, the first wall surface 71 is formed so as to extend along the entire circumference of the edge portion of the open mouth 67 of the casing 8. Likewise, the second wall surface 72 is formed on the lid part 24 so as to extend along the entire circumference of the edge portion of the open mouth 67 of the casing 8.

As shown in FIG. 7, a predetermined gap is provided between the first wall surface 71 and the second wall surface 72. A space corresponding to the gap serves as an in-casing burr storage space 69. As shown in FIG. 7, the in-casing burr storage space 69 is in communication with the welded portion 68, and provided inside the welded portion 68.

At a time of welding the casing 8 and the lid part 24 to each other, a burr (welding dust) 75 is generated. The burr 75 is generated so as to spread around from the welded portion 68. Therefore, the burr 75, if left untreated, scatters within the board storage space 23, which may cause a failure. This is why the in-casing burr storage space 69 that is in communication with the welded portion 68 is provided inside the welded portion 68 as described above. This allows the burr 75 generated by welding to be stored in the in-casing burr storage space 69.

In this embodiment, furthermore, a burr receiver 76 is provided so as to be opposed to an end portion (in FIG. 7, a lower end portion) of the in-casing burr storage space 69, as shown in FIG. 7. Referring to FIG. 6, the burr receiver 76 is formed so as to extend along the entire circumference of the edge portion of the open mouth 67 of the casing 8. Referring to FIG. 7, the burr 75 existing in the in-casing burr storage space 69 can be received by the burr receiver 76 before the burr drops into the board storage space 23. This can trap the burr 75 in the in-casing burr storage space 69. The above-described configuration can effectively prevent the burr 75 generated by welding from scattering in the board storage space 23.

In this embodiment, as shown in FIG. 7, the lid part 24 has a third wall surface 73 that is formed outside the welded portion 68. The casing 8 has a fourth wall surface 74 that is opposed to the third wall surface 73. The third wall surface 73 and the fourth wall surface 74 are formed so as to extend along the entire circumference of the edge portion of the open mouth 67.

As shown in FIG. 7, a predetermined gap is provided between the third wall surface 73 and the fourth wall surface 74. A space corresponding to the gap serves as an out-of-casing burr storage space 70. As shown in FIG. 7, the out-of-casing burr storage space 70 is in communication with the welded portion 68, and provided outside the welded portion 68.

At a time of welding, the burr 75 is generated not only inside the casing 8 but also outside the casing 8. The burr 75 generated in welding, if exposed to the outside of the casing 8, spoils the appearance of the casing 8. The burr 75 generated in welding, if scattering out of the casing 8, contaminates a work space where a welding operation is performed. This is why the out-of-casing burr storage space 70 that is in communication with the welded portion 68 is provided outside the welded portion 68, too, as described above. This can store the burr 75 generated by welding. As a result, the burr 75 in welding can be prevented from being exposed to the outside of the casing 8, and thus the appearance of the casing 8 can be prevented from being spoiled.

Next, configurations of the casing 8 and the lid part 24 before welding will be described with reference to FIG. 8.

Figure 8:
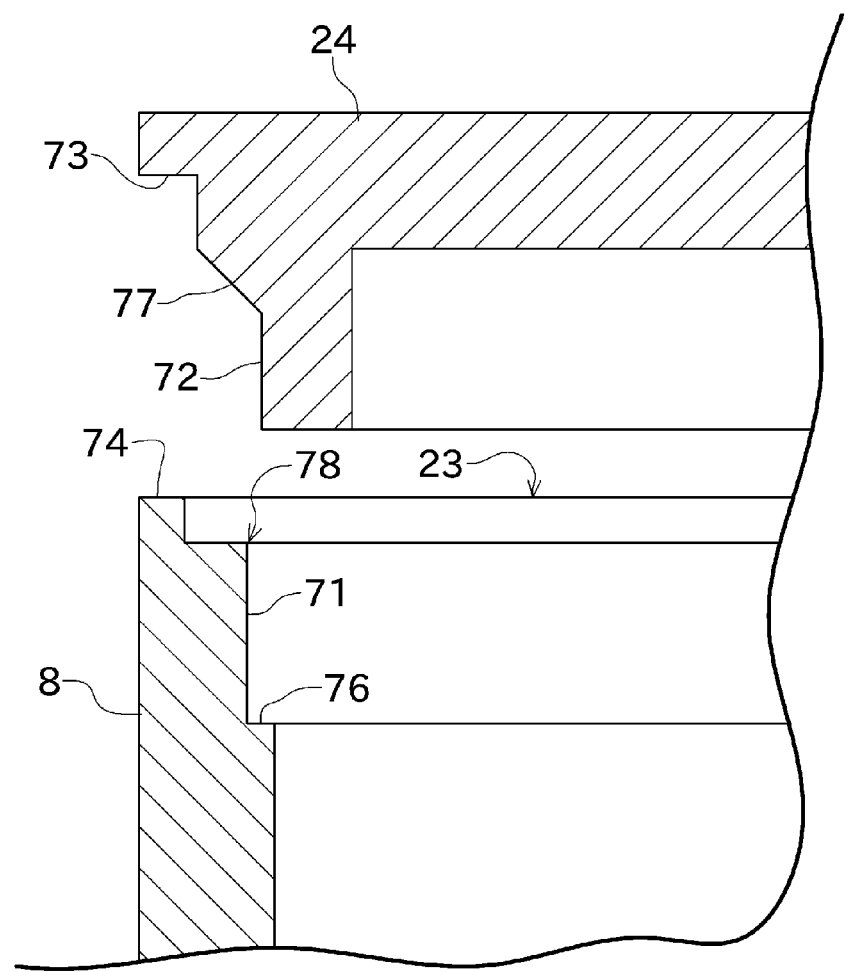
FIG. 8 A front cross-sectional view showing a casing and a lid part before welding.

As shown in FIG. 8, a tapered surface 77 is provided on the lid part 24 before welding. The tapered surface 77 is formed on the lid part 24 so as to extend along the entire circumference of the edge portion of the open mouth 67 of the casing 8. The tapered surface 77 is arranged obliquely with its end portion (in FIG. 8, a lower end portion) at the casing 8 side being located inner than its end portion (in FIG. 8, an upper end portion) at the lid part 24 side. The tapered surface 77 of this embodiment is formed obliquely outward. The tapered surface 77 is formed outside the second wall surface 72 and inside the third wall surface 73.

As shown in FIG. 8, before welding, the casing 8 has a contact portion 78. The contact portion 78 is formed so as to extend along the entire circumference of the edge portion of the open mouth 67. The contact portion 78 is formed so as to protrude to be opposed to the tapered surface 77 of the lid part 24. For example, as shown in FIG. 8, the contact portion 78 of this embodiment is formed as an angled corner protruding obliquely inward. The contact portion 78 is arranged outside the first wall surface 71 and inside the fourth wall surface.

Next, a method for manufacturing the battery state detection device 1 of this embodiment will be described.

Figure 9:
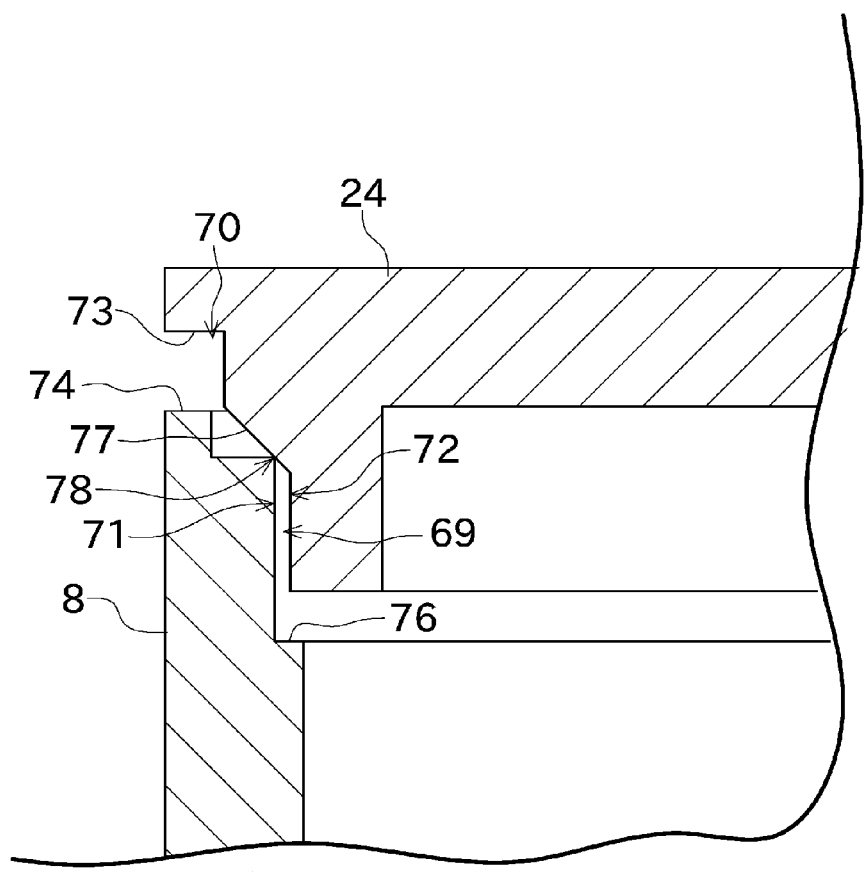
FIG. 9 A front cross-sectional view showing the lid part being set to the casing.

In a manufacturing method according to this embodiment, to weld the casing 8 and the lid part 24 to each other, firstly, the lid part 24 is set so as to close the open mouth of the casing 8, as shown in FIG. 9.

In this embodiment, the contact portion 78 of the casing 8 is configured to be in contact with the tapered surface 77 of the lid part 24. Therefore, even if the position of the lid part 24 is misaligned relative to the casing 8 after the lid part 24 is set to the casing 8, the tapered surface 77 guides the lid part 24 so that the position misalignment is corrected naturally. Thus, in this embodiment, the casing 8 and the lid part 24 are in contact with each other on the tapered surface 77. This can correct a position misalignment between the casing 8 and the lid part 24, to achieve highly accurate welding.

Additionally, setting the lid part 24 to the casing 8 causes the in-casing burr storage space 69 to appear between the first wall surface 71 and the second wall surface 72, and causes the out-of-casing burr storage space 70 to appear between the third wall surface 73 and the fourth wall surface 74.

Figure 10:
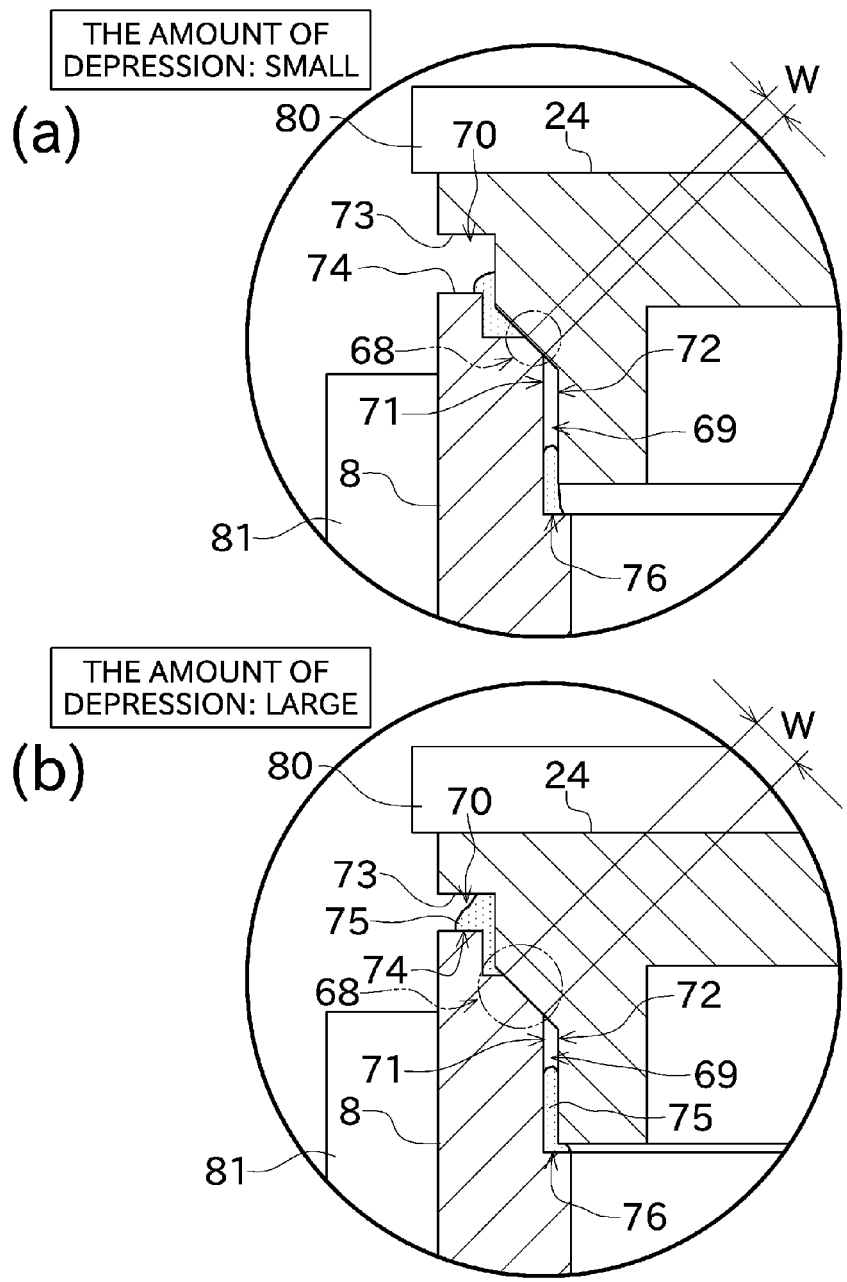
FIG. 10 Front cross-sectional views showing a situation where the casing and the lid part are welded to each other.

Then, as shown in FIG. 10, an ultrasonic horn 80 is applied to the lid part 24 from the side opposite to the casing 8. Ultrasonic vibrations of the ultrasonic horn 80 are caused with the ultrasonic horn 80 exerting a force in a direction (in FIG. 10, downward) pressing the lid part 24 against the casing 8. As a result, portions of the casing 8 and the lid part 24 in contact with each other, that is, the tapered surface 77 and the contact portion 78, are welded by the ultrasonic vibrations, so that the welded portion 68 is formed (welding step). The burr 75 generated at this time is stored in the burr storage spaces 69 and 70, as described above. Therefore, scattering of the burr 75 inside and outside the casing 8 is prevented.

In the welding step, a pressing force exerted by the ultrasonic horn 80 pushes the lid part 24 into the casing 8. Here, as shown in the drawings, the tapered surface 77 extends obliquely relative to the direction (in FIG. 10, the downward direction) in which the lid part 24 is pushed in. As the lid part 24 is pushed in, the area where the tapered surface 77 is in contact with the contact portion 78 increases so that a welding width W of the welded portion 68 increases. Accordingly, the manufacturing method according to this embodiment is able to adjust the welding width W of the welded portion 68 by controlling the amount of depression made by the ultrasonic horn 80 (see FIG. 10).

The manufacturing method according to this embodiment, in which the casing 8 and the lid part 24 are welded on the tapered surface 77, is able to easily adjust the welding width W by controlling the amount of depression made by the ultrasonic horn 80. Accordingly, in the manufacturing method according to this embodiment, the battery state detection device 1 having a desired degree of waterproofness can be manufactured.

In the welding step mentioned above, the lid part 24 is pressed against the casing 8. There is a risk that loading applied to the casing 8 at this time might deform the casing 8. Therefore, measures to prevent deformation of the casing 8 needs to be taken.

In this respect, in the welding step of this embodiment, the tapered surface 77 which is formed on the lid part 24 is pressed against the contact portion 78 of the casing 8. As a result, a force in a direction that outwardly expands the outer peripheral wall surface of the casing is applied on the casing 8. This, conversely, means that the welding step of this embodiment involves no risk that the casing 8 might deform with its outer peripheral wall surface leaning inward.

In the manufacturing method according to this embodiment, the direction in which the casing 8 deforms is obvious, and therefore taking measures to prevent the deformation is easy. More specifically, in the welding step of this embodiment, an anti-deformation jig 81 is arranged from outside of and in contact with the outer peripheral wall surface of the casing 8, and then the welding is performed with the ultrasonic horn 80, as shown in FIG. 10. This can ensure that the anti-deformation jig 81 prevents deformation of the outer peripheral wall surface of the casing 8 which may otherwise be caused by outward expansion. Accordingly, the welding can be performed with an accuracy, and thus the battery state detection device 1 having a high reliability can be manufactured.

As thus far described, the manufacturing method according to this embodiment includes the welding step of performing ultrasonic welding between the casing 8 and the lid part 24 under a state where the tapered surface 77 of the lid part 24 is in contact with the contact portion 78 of the casing 8.

Since the welding is performed with the tapered surface 77 in contact, the tapered surface 77 guides the lid part 24 and the casing 8 during the welding, so that their relative positions are settled naturally. This enables the welding to be performed with a high accuracy, thus achieving the casing 8 and the lid part 24 structured with a high reliability.

The battery state detection device 1 manufactured through the above-described manufacturing method includes the welded portion 68 where the casing 8 and the lid part 24 are connected by welding, the welded portion 68 being formed along the edge portion of the open mouth 67 of the casing 8.

In this manner, welding the casing 8 and the lid part 24 to each other along the edge portion of the open mouth 67 of the casing 8 can ensure hermetic sealing of the casing 8 without using an O-ring.

Next, a second characteristic configuration of this embodiment will be described. Prior to the description, other problems to be solved by the battery state detection device 1 of this embodiment will be described.

The demand for a high reliability of a battery state detection device particularly in the field of vehicles is as described above, but if, for example, there is rattling of a circuit board in a casing of the battery state detection device, a failure is likely to occur due to an influence of vibrations. It is therefore necessary to prevent rattling of the circuit board in the casing of the battery state detection device.

In this respect, the conventional battery state detection device is configured such that the casing is filled with a sealant containing urethane or the like and the circuit board is encapsulated with the sealant. Such a sealant encapsulating the circuit board provides a vibration absorption effect so that rattling of the circuit board is prevented.

Additionally, encapsulating the circuit board with the sealant also provides a waterproof effect so that adhering of water to the circuit board is prevented. Thus, the conventional battery state detection device, in which the casing is filled with the sealant, achieves improvement in the reliability and durability of the battery state detection device by providing the vibration absorption effect and the waterproof effect.

The conventional configuration described above, however, requires a large amount of sealant because the circuit board is encapsulated with the sealant, which causes a cost increase. Moreover, filling with a large amount of sealant presents a problem of an increased weight of the battery state detection device.

In view of the circumstances described above, the battery state detection device 1 of this embodiment aims to prevent rattling of the circuit board 9 with a simple configuration not using a large amount of sealant, by adopting the following configuration.

As shown in FIG. 6, two anti-rattling pins (a position settlement pin 56 and a rotation restriction pin 57) are provided in the storage space 23 of the casing 8 of this embodiment. The anti-rattling pins 56 and 57, whose proximal ends are located on a bottom surface (the partition wall 26 described above) of the storage space 23, are formed so as to protrude toward the opening of the storage space 23. The circuit board 9 has two reception holes (a position settlement hole 58 and a rotation restriction hole 59) corresponding to the anti-rattling pins 56 and 57, respectively. As shown in FIG. 6, the position settlement pin 56 is receivable in the position settlement hole 58 and the rotation restriction pin 57 is receivable in the rotation restriction hole 59.

Figure 11:
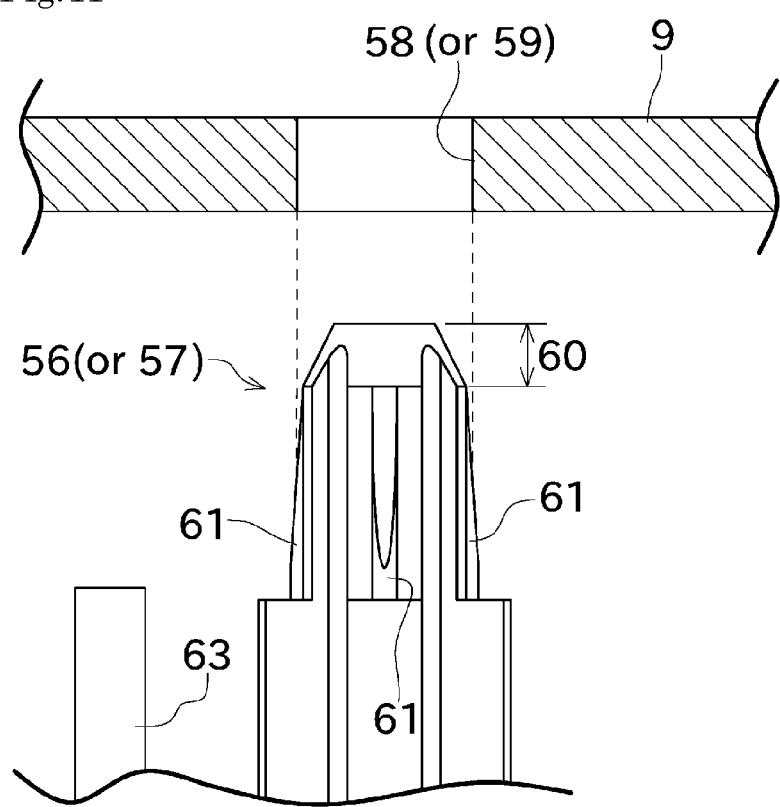
FIG. 11 A enlarged view of an anti-rattling rib.
Figure 12:
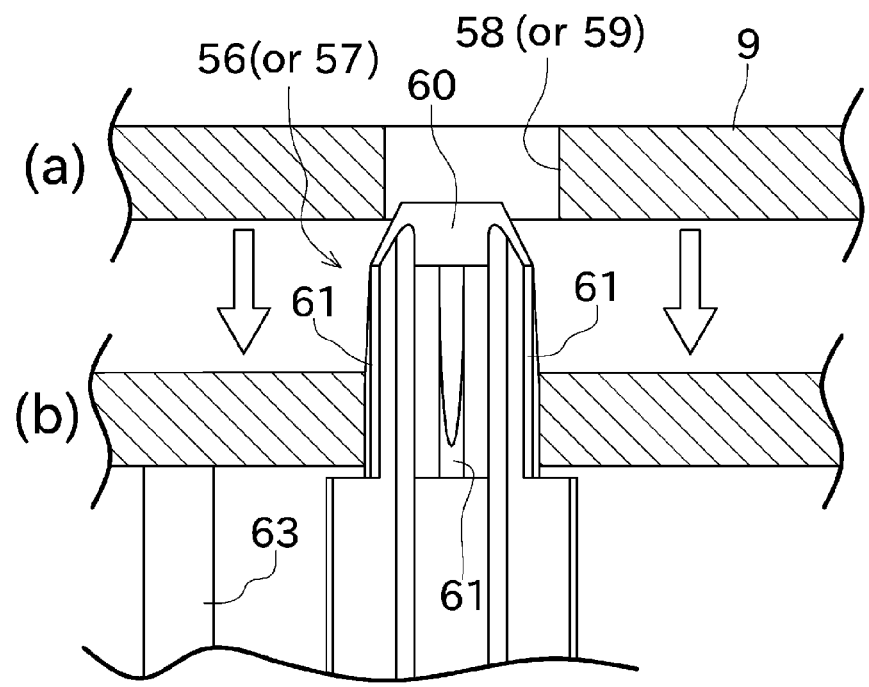
FIG. 12 An enlarged view illustrating a situation where a circuit board is pushed to receive the anti-rattling rib.

Configurations of the anti-rattling pins 56 and 57 will be described with reference to FIGS. 11 and 12. Since the two anti-rattling pins 56 and 57 have similar configurations, only the position settlement pin 56 is illustrated in FIGS. 11 and 12. Differences between the configuration of the position settlement pin 56 and the configuration of the rotation restriction pin 57 will be described as need arises.

Each of the anti-rattling pins 56 and 57 includes, in its distal end portion, a tapered portion 60. The tapered portion 60 is tapered with its diameter increasing from the distal side (in FIG. 11, the upper side) toward the proximal side (in FIG. 11, the lower side) of each of the anti-rattling pins 56 and 57. As shown in FIG. 11, the tapered portion 60 is formed such that the lower end portion thereof has a diameter smaller than the width of the corresponding reception hole 58 (or 59).

Figure 14:
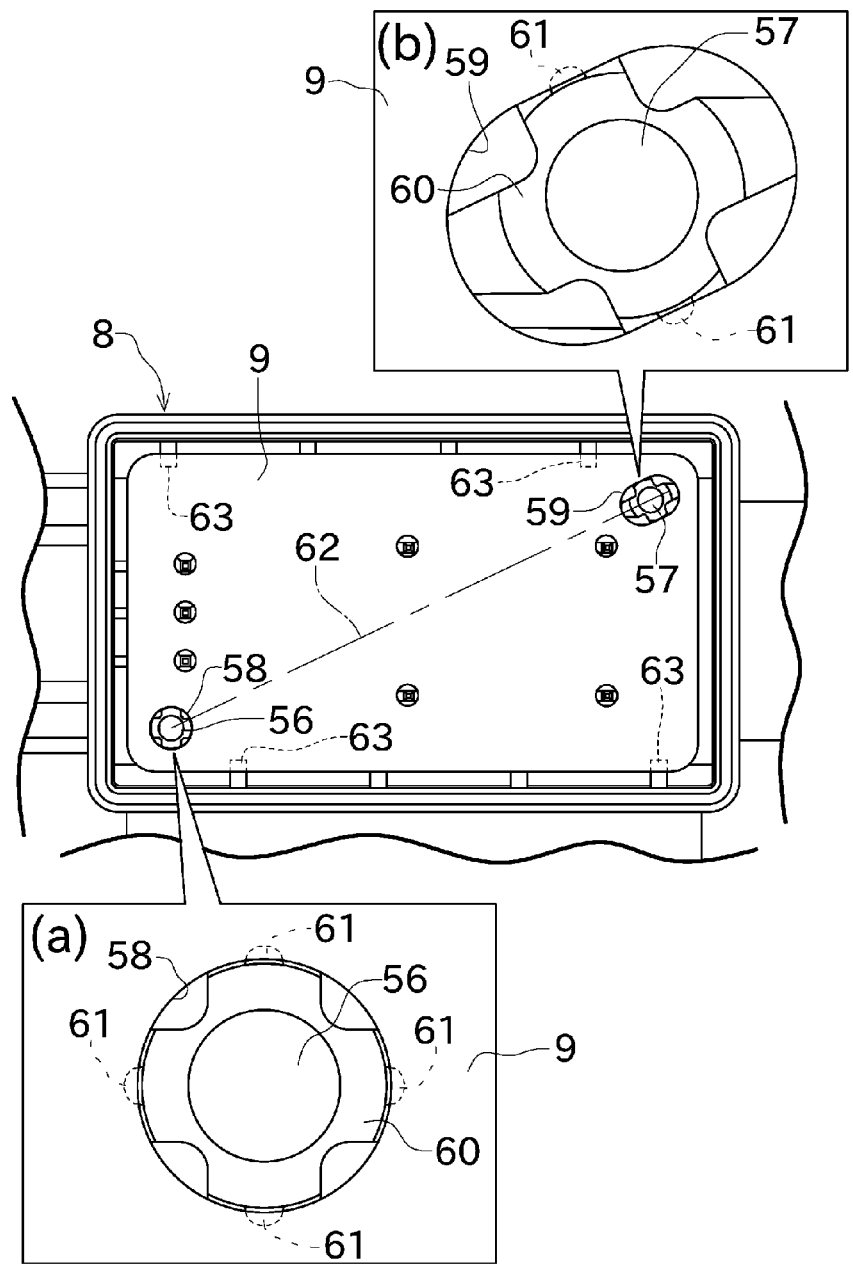
FIG. 14 A plan view showing a state where the position of the circuit board in the storage space is settled.

Each of the anti-rattling pins 56 and 57 includes crash ribs 61 provided at the further proximal side relative to the lower end portion of the tapered portion 60. The crash ribs 61 protrude in a radial direction of the anti-rattling pins 56 and 57. The crash rib 61 has a rib-like shape extending in the longitudinal direction of the anti-rattling pins 56 and 57. A plurality of the crash ribs 61 are formed at equal intervals in a circumferential direction of the anti-rattling pins 56 and 57. For example, as shown in FIG. 14, the position settlement pin 56 includes four crash ribs 61 arranged at intervals of 90 degrees, and the rotation restriction pin 57 includes two crash ribs 61 arranged at intervals of 180 degrees.

As shown in FIG. 11, the crash rib 61 is tapered such that it flares radially outward toward the proximal side (in FIG. 11, the lower side) of the anti-rattling pins 56 and 57. In lower end portions of the crash ribs 61, the diameter of the anti-rattling pin 56 (or 57) including the crash ribs 61 is larger than the width of the reception hole 58 (or 59).

The anti-rattling pins 56 and 57 are provided in the above-described manner. Therefore, even when, for example, the center of the reception hole 58 (or 59) of the circuit board 9 is eccentric from the center of the anti-rattling pin 56 (or 57) as shown in FIG. 12(*a*), the tapered portion 60 serves to guide the reception hole 58 (or 59). This facilitates insertion of the anti-rattling pin 56 (or 57) in the reception hole 58 (or 59).

In the state shown in FIG. 12(*a*), further pushing the circuit board 9 causes the tapered crash ribs 61 to come into contact with an inner circumferential wall of the reception hole 58 (or 59) (the state shown in FIG. 12(*b*)).

Figure 13:
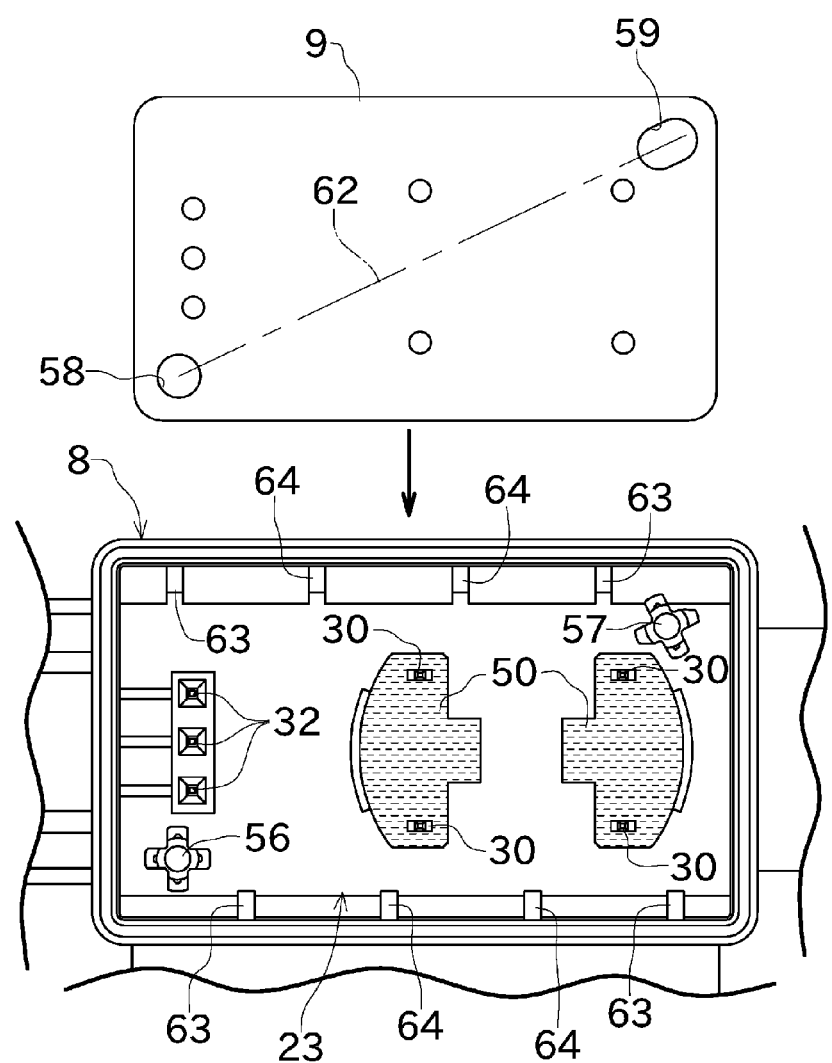
FIG. 13 A plan view showing the circuit board and a storage space provided in the casing.

As shown in FIGS. 13 and 14, the position settlement hole 58 of the circuit board 9 is a circular hole. Inserting the position settlement pin 56 through the position settlement hole 58 causes the four crash ribs 61 of the position settlement pin 56 to come into contact with the inner circumferential wall of the position settlement hole 58, and the contact occurs in four directions (upward, downward, leftward, and rightward directions of FIG. 14). This makes the position settlement hole 58 centered at the axis of the position settlement pin 56, so that the position of the circuit board 9 is settled.

As shown in FIGS. 13 and 14, the rotation restriction hole 59 is an elongated hole elongated along a straight line 62 connecting this rotation restriction hole 59 to the position settlement hole 58. As shown in FIG. 14, the two crash ribs 61 of the rotation restriction pin 57 protrude in a direction perpendicular to the straight line 62. Inserting the rotation restriction pin 57 through the rotation restriction hole 59 causes the crash ribs 61 of the rotation restriction pin 57 to come into contact with the inner circumferential wall of the rotation restriction hole 59, and the contact occurs in the direction perpendicular to the straight line 62. This can fix the rotational position of the circuit board 9 around the position settlement pin 56.

Since the crash rib 61 has a tapered shape, further pushing the circuit board 9 makes the crash rib 61 bite into the inner circumferential wall of the reception hole 58, 59. Making the crash ribs 61 bite into the inner circumferential wall of the reception hole 58 (or 59) enables the circuit board 9 to be firmly fixed in a plane (in a plane shown in FIG. 14) perpendicular to the longitudinal direction of the anti-rattling pins 56 and 57. In this manner, by means of the anti-rattling pins 56 and 57, rattling of the circuit board 9 can be prevented in the plane perpendicular to the longitudinal direction of these pins.

In this embodiment, as shown in FIG. 13, each of the reception holes 58 and 59 is provided in the vicinity of a corner of the circuit board 9 and arranged on a diagonal line of the circuit board 9. Therefore, a long distance can be ensured as the distance between two points (the distance between the two anti-rattling pins 56 and 57) at which the position of the circuit board 9 is settled. Thus, the effect of preventing rattling of the circuit board 9 can be exerted well.

In this embodiment, the rotation restriction hole 59 is an elongated hole. Therefore, tolerances of the distance between the two anti-rattling pins 56 and 57 can be absorbed. Accordingly, the effect of preventing rattling of the circuit board 9 can be exerted well without the need to adopt tight tolerances of the anti-rattling pins 56 and 57.

In this embodiment, as shown in FIGS. 4, 6, and 13, etc., a plurality of board fixing ribs 63 are provided on an inner wall surface defining the storage space 23 of the casing 8. The plurality of board fixing ribs 63 protrude toward the inside of the storage space 23.

Each of the board fixing ribs 63 has an elongated shape elongated in the direction parallel to the longitudinal direction of the anti-rattling pins 56 and 57, as shown in FIGS. 4 and 6. Referring to FIG. 14, when seen in the longitudinal direction of the anti-rattling pins 56 and 57, the positions to which the board fixing ribs 63 protrude are located inside the outer edge of the circuit board 9.

Accordingly, inserting the anti-rattling pins 56 and 57 through the reception holes 58 and 59 of the circuit board 9 and pushing the circuit board 9 as illustrated in FIG. 12 causes the board fixing ribs 63 to come into contact with one side surface (in FIG. 12, a lower surface) of the circuit board 9, and the contact occurs from the proximal side (in FIG. 12, from the lower side) of the anti-rattling pins 56 and 57 (the state shown in FIG. 12(b)). Thus, the board fixing ribs 63 serve to settle the position of the circuit board 9 with respect to the longitudinal direction of the anti-rattling pins 56 and 57 (in FIG. 12, the vertical direction).

To surely settle the position of the circuit board 9, it is necessary to provide the board fixing ribs 63 at three or more positions. Because of the accuracy of formation of the casing 8, however, even though a large number of board fixing ribs 63 are formed, it is impossible that all of the board fixing ribs 63 have exactly the same height (the same vertical position in FIG. 12). Therefore, providing too many board fixing ribs 63 results in a difficulty in position settlement of the circuit board 9.

This is why the number of board fixing ribs 63 is suitably three or four. In this embodiment, as shown in FIG. 13, etc., two board fixing ribs 63 (in total, four board fixing ribs 63) are provided on each of the opposed wall surfaces defining the long sides of the casing 8 (the sides extending in the horizontal direction in FIG. 13). As shown in FIG. 14, the board fixing ribs 63 is arranged corresponding to the four corners of the circuit board 9, respectively. The board fixing ribs 63 arranged in this manner make the circuit board 9 supported at the four corners. Accordingly, the position of the circuit board 9 can be settled stably.

Here, in this embodiment, the position of the circuit board 9 is settled by means of the two anti-rattling pins 56 and 57 arranged on the straight line 62. If the board fixing ribs 63 are not provided, the circuit board 9 is likely to rattle in such a manner as to swing around the straight line 62. From the viewpoint of effective prevention of swinging of the circuit board 9 around the straight line 62, the board fixing ribs 63 are suitably arranged at positions distant from the straight line 62.

Therefore, the casing 8 of this embodiment is configured such that, among the four board fixing ribs 63 corresponding to the four corners of the circuit board 9, the two board fixing ribs 63 arranged at the two corners where the anti-rattling pins 56 and 57 are provided are located at positions slightly closer to the center of the long side of the casing 8 than the positions of the other two board fixing ribs 63 arranged at the remaining two corners are. As shown in FIG. 13, the four board fixing ribs 63 provided on the opposed long sides (the sides extending in the horizontal direction in FIG. 13) of the casing 8 are arranged in a staggered pattern (in an alternate manner) with respect to the direction parallel to the long sides. Arranging the board fixing ribs 63 in this manner provides effective prevention of rattling of the circuit board 9 around the straight line 62, thus enabling the circuit board 9 to be supported more stably.

Since the board fixing ribs 63 are provided on the wall surface of the casing 8, the strength of the wall surface of the casing 8 is improved, and therefore deformation is not likely to occur. As a result, for example, occurrence of warping of the wall surface during formation of the casing 8 can be prevented. Thus, the board fixing ribs 63 serve also to reinforce the wall surface of the casing 8.

From the viewpoint of reinforcing the wall surface of the casing 8, it is preferable that many ribs are provided on the wall surface with the intervals of the ribs being narrow. However, as described above, increasing the number of the board fixing ribs 63 leads to a difficulty in position settlement of the circuit board 9. In the casing 8 of this embodiment, therefore, anti-warp ribs 64 different from the board fixing ribs 63 are provided on the wall surface of the casing 8. As shown in FIGS. 4, 6, and 13, etc., a plurality of the anti-warp ribs 64 are provided between the board fixing ribs 63. Each of the anti-warp ribs 64, similarly to the board fixing rib 63, has a rib-like shape protruding toward the inside of the storage space 23 and elongated in the direction parallel to the longitudinal direction of the anti-rattling pins 56 and 57.

Providing the plurality of board fixing ribs 63 and anti-warp ribs 64 on the wall surface of the casing 8 in this manner provides effective prevention of, for example, occurrence of warping of the wall surface during formation of the casing 8. Accordingly, the reliability of the casing 8 can be enhanced.

Each anti-warp rib 64 has its distal end (its end portion at the distal side with respect to the longitudinal direction of the anti-rattling pins 56 and 57) positioned closer to the proximal side (the proximal side with respect to the longitudinal direction of the anti-rattling pins 56 and 57) than the distal end of each board fixing rib 63 is. In other words, as shown in FIG. 4, while the board fixing ribs 63 are in contact with the circuit board 9, the anti-warp ribs 64 are not in contact with the circuit board 9. This enables the board fixing ribs 63 to settle the position of the circuit board 9 without being disturbed by the anti-warp ribs 64.

As thus far described, the battery state detection device 1 of this embodiment includes the shunt resistor 7, the circuit board 9, and the casing 8. The circuit board 9 detects a current having flowed through the shunt resistor 7. The casing 8 includes the storage space 23 that stores the circuit board 9. The plurality of anti-rattling pins 56 and 57 are provided in the storage space 23 of the casing 8. Each of the anti-rattling pins includes the tapered portion 60 and the plurality of crash ribs 61. The tapered portion 60 has a tapered shape and provided at the distal end of the anti-rattling pin. Each of the plurality of crash ribs 61 has a rib-like shape starting from a position located at the proximal side relative to the tapered portion 60 and extending in the longitudinal direction of the pin. Each of the crash ribs 61 has a tapered shape that flares out toward the proximal side of the pin. The circuit board 9 has the reception holes 58 and 59 that receive the anti-rattling pins 56 and 57.

In the battery state detection device 1 of this embodiment, the plurality of board fixing ribs 63 are provided on the wall surface of the casing 8. The plurality of board fixing ribs 63 are in contact with the circuit board 9. The contact occurs from the proximal side of the anti-rattling pins 56 and 57.

The anti-rattling pins 56, 57 and the board fixing ribs 63 described above enable the position of the circuit board 9 to be stably settled in the storage space 23, so that rattling is prevented.

In the conventional battery state detection device, on the other hand, it is necessary that the storage space is filled with the sealant and the circuit board is encapsulated with the sealant, in order to suppress rattling of the circuit board. The configuration of this embodiment, however, can effectively prevent rattling of the circuit board 9 without the need of such a sealant.

The battery state detection device 1 of this embodiment adopts a configuration in which a sealant for encapsulating the circuit board 9 is not provided. More specifically, in this embodiment, the storage space 23 is filled with no sealant. This can considerably reduce the amount of sealant consumed, as compared with the conventional configuration, thus reducing the cost of manufacturing the battery state detection device 1. Thus, this embodiment can prevent rattling of the circuit board 9 with a simple configuration, and can improve the reliability of the battery state detection device 1.

In the conventional battery state detection device, as mentioned above, the sealant is loaded so as to encapsulate the circuit board. This sealant exerts the waterproof effect, thus providing the effect of enhancing the waterproofness of the casing. In this embodiment, on the other hand, a sealant for encapsulating the circuit board 9 is not provided, and therefore a degree of waterproofness equivalent to that of the conventional configuration cannot be obtained if no measures are taken.

Next, therefore, a configuration for ensuring waterproofness of the casing 8 of the battery state detection device 1 of this embodiment will be described.

A portion corresponding to a gap between the shunt resistor 7 and the casing 8 can be a path through which water may enter the casing 8. Examples of such a portion is denoted by the reference numeral 33 and indicated by the bold line in FIG. 4. The casing 8 of this embodiment includes the partition wall 26 arranged between the shunt resistor 7 and the storage space 23. The partition wall 26 has the terminal pass-through holes 51 that allow the board connection terminals 15 to pass therethrough. There is a possibility that water entering the casing 8 through an entry path 33 may enter the storage space 23 through the terminal pass-through holes 51. In this embodiment, a sealant for encapsulating the circuit board 9 is not provided. Therefore, once water enters the storage space 23, the water can adhere to the circuit board 9, which may cause a malfunction or failure.

Conversely, as long as the terminal pass-through holes 51 are closed, entry of water into the storage space 23 can be hindered, and therefore adhering of the water to the circuit board 9 does not occur, either.

Therefore, the battery state detection device 1 of this embodiment is configured such that the terminal pass-through holes 51 are filled with a sealant 50.

Providing the partition wall 26 that separates the storage space 23 and the shunt resistor 7 from each other and additionally filling the terminal pass-through holes 51 with the sealant 50 can prevent water from entering the storage space 23 from the shunt resistor 7 side. Since it suffices that only the terminal pass-through holes 51 are filled with the sealant 50, the amount of sealant consumed can be considerably reduced as compared with the conventional configuration in which the storage space 23 is filled with the sealant, while a degree of waterproofness equivalent to that of the conventional configuration is obtained.

Figure 15:
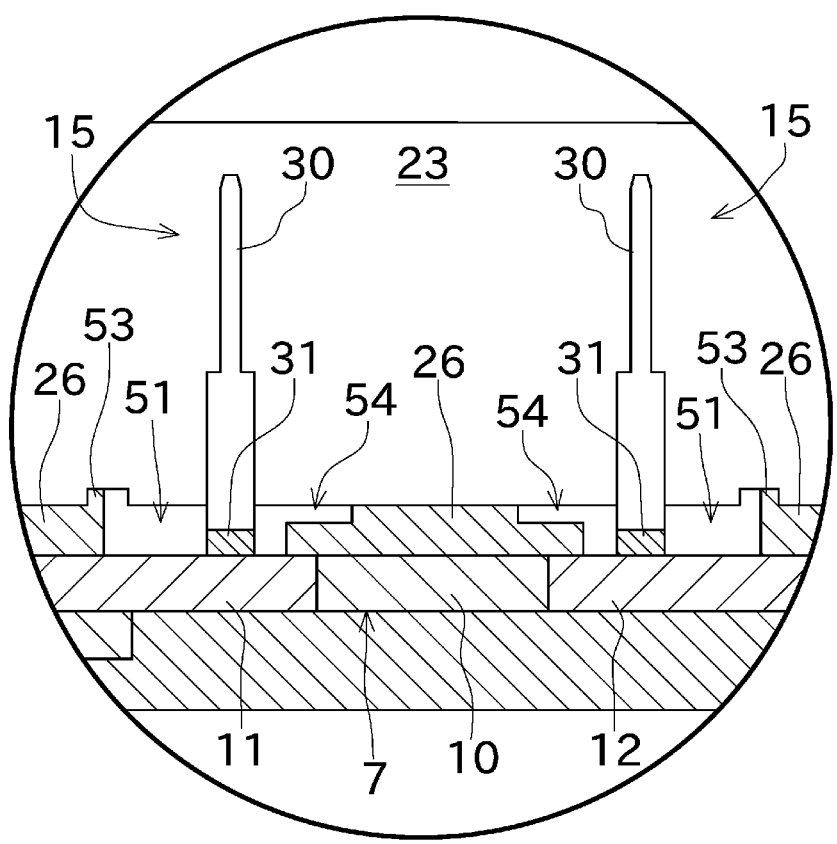
FIG. 15 A front cross-sectional view showing terminal pass-through holes and therearound on an enlarged scale.

FIG. 15 shows the terminal pass-through holes 51 on an enlarged scale. FIG. 15 shows a state before the terminal pass-through holes 51 are filled with the sealant 50. In this embodiment, the terminal pass-through holes 51 are through holes formed through the partition wall 26. Accordingly, in the state (the state shown in FIG. 15) before the terminal pass-through holes 51 are filled with the sealant 50, the shunt resistor 7 is exposed to the storage space 23 via the terminal pass-through holes 51. As shown in FIG. 15, the shunt resistor 7 closes the terminal pass-through holes 51 from one side. It can therefore be considered that the shunt resistor 7 constitutes a bottom surface of the terminal pass-through hole 51.

As shown in FIG. 15, in the shunt resistor 7 of this embodiment, at least the resistor element 10 is covered with the partition wall 26. Thus, even in the state before the terminal pass-through holes 51 are filled with the sealant 50, at least the resistor element 10 is not exposed to the storage space 23 side. Such a configuration with the resistor element 10 not exposed can maintain an accuracy of sensing.

As described above, one board connection terminal 15 is provided on each of the first conductor part 11 and the second conductor part 12 (that is, two board connection terminals 15 are provided on the shunt resistor 7). As shown in FIG. 15, two terminal pass-through holes 51 each corresponding to each of the two board connection terminals 15 are provided.

Figure 16:
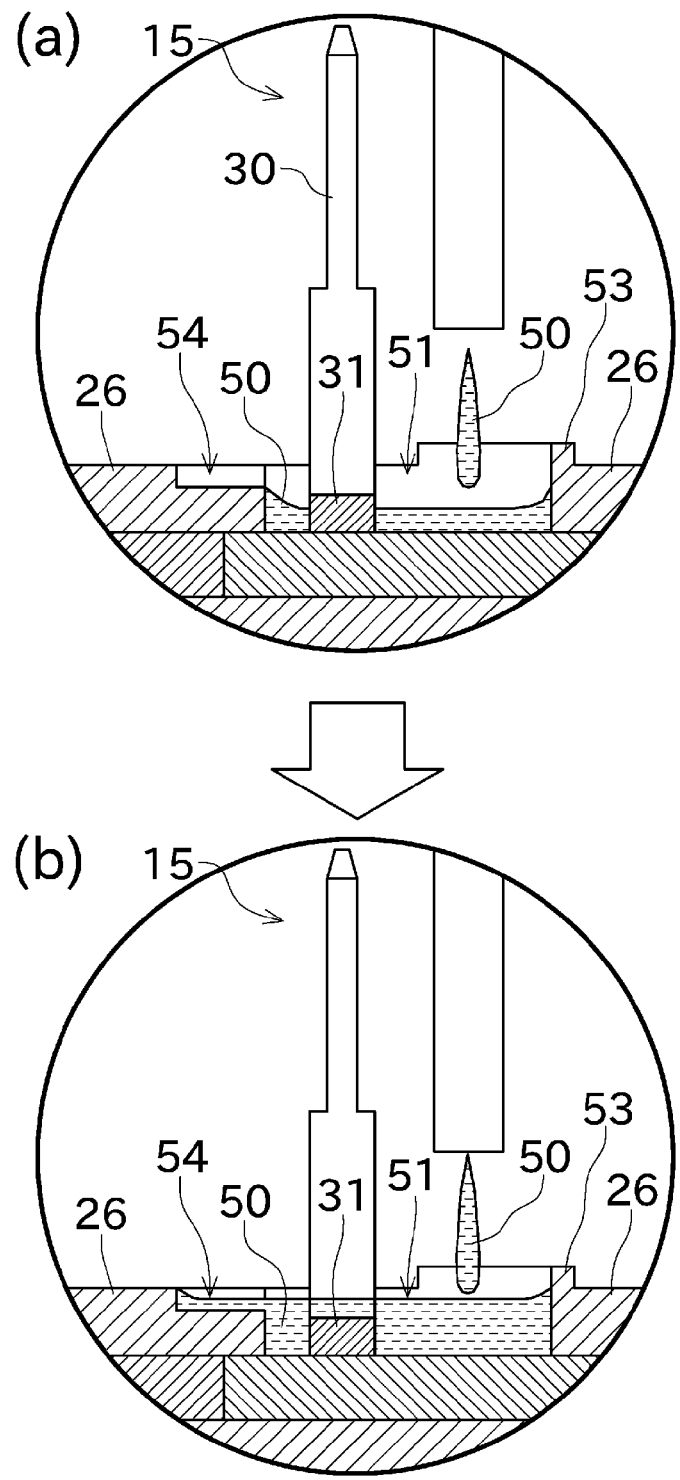
FIG. 16 Enlarged front cross-sectional views showing injection of a sealant.
Figure 17:
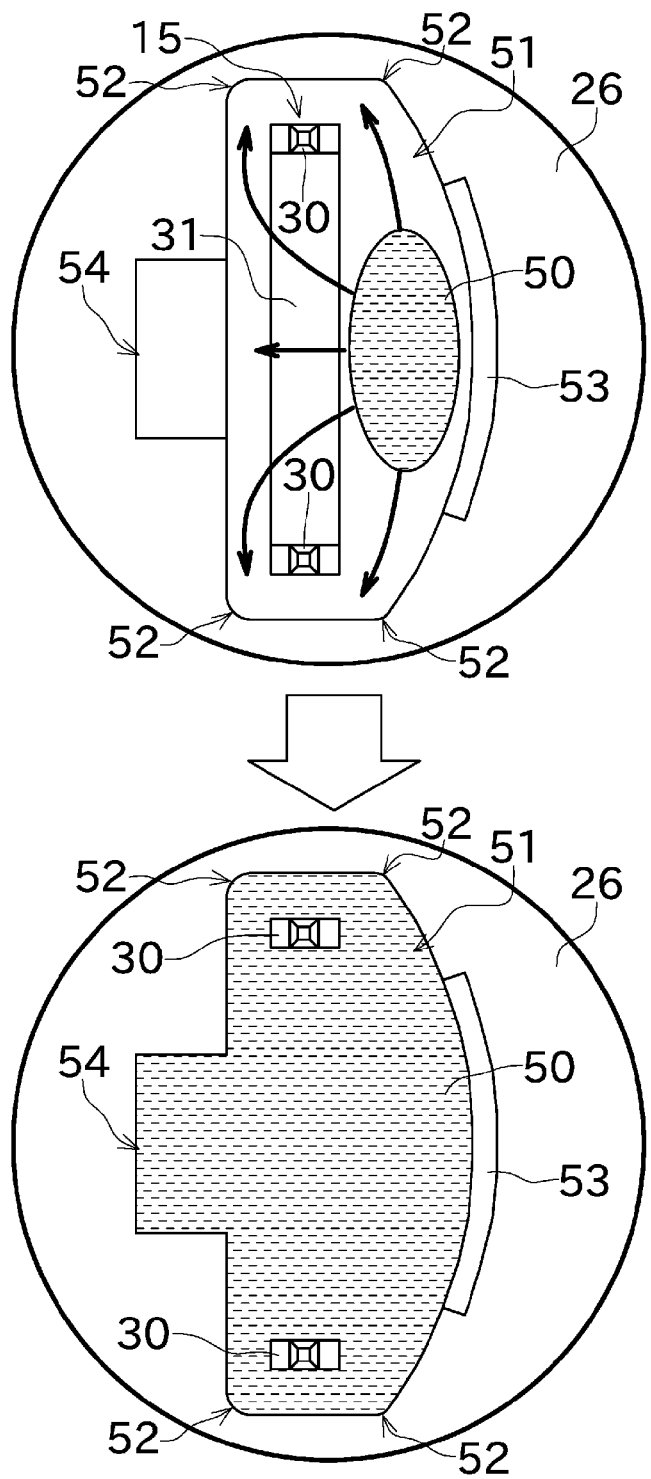
FIG. 17 Enlarged plan views showing injection of the sealant.

FIGS. 16 and 17 show a situation where a sealant is injected into the terminal pass-through hole 51. In this embodiment, as shown in FIG. 17, a bevel 52 is formed in each corner portion of the contour of an edge portion of the terminal pass-through hole 51. That is, the contour of the edge portion of the terminal pass-through hole 51 has a rounded-off smooth shape. This allows the sealant 50 injected into the terminal pass-through hole 51 to flow in a good manner, so that the entire region of the terminal pass-through hole 51 can be filled with the sealant 50 without fail.

In this embodiment, as shown in FIGS. 16 and 17, an overflow protection wall 53 extending along the edge portion of the terminal pass-through hole 51 is provided in the vicinity of a position where the sealant 50 is injected. The overflow protection wall 53 protrudes from a wall surface of the partition wall 26. The overflow protection wall 53 can prevent the injected sealant 50 from overflowing out of the terminal pass-through hole 51. Thus, the terminal pass-through hole 51 can be filled with the sealant 50 without fail.

If the amount of the sealant 50 injected into the terminal pass-through hole 51 is less than a predetermined amount, an expected degree of waterproofness cannot be exerted. However, there is a variation in the amount of the sealant 50 per injection. It cannot always be ensured that a sufficient amount of the sealant 50 is injected. It is therefore necessary to determine by visual observation (or by any appropriate inspection apparatus) that a predetermined amount or more of the sealant 50 has been injected.

In this embodiment, therefore, a filling amount checker 54 is provided in the partition wall 26 of the casing 8. As shown in FIG. 16, the filling amount checker 54 is a recess formed in the partition wall 26, and configured to be in communication with the terminal pass-through hole 51. The depth of the filling amount checker 54 is less than the depth of the terminal pass-through hole 51.

In this configuration, the sealant 50 does not flow into the filling amount checker 54 as long as the amount of the sealant 50 injected into the terminal pass-through hole 51 is less than the predetermined amount (the state shown in FIGS. 16(*a*) and 17(*a*)). When the amount of the sealant 50 injected into the terminal pass-through hole 51 exceeds the predetermined amount, the sealant 50 flows into the filling amount checker 54 (the state shown in FIGS. 16(*b*) and 17(*b*)). The depth of the filling amount checker 54 can be set appropriately in accordance with the amount of the sealant 50 required to be injected for exerting a demanded degree of waterproofness.

Accordingly, based on determination by visual observation (or by any appropriate inspection apparatus) that the sealant 50 has flowed into the filling amount checker 54, it can be determined that the predetermined amount or more of the sealant 50 has been injected into the terminal pass-through hole 51. As a result, a variation in the degree of waterproofness, which would be caused by a variation in the amount of the injected sealant 50, can be prevented.

Next, a variation of the above-described embodiment will be described with reference to FIG. 18. In the description of this variation, members identical or similar to those of the above-described embodiment are given the same reference signs on the drawings, and descriptions thereof may be omitted.

In the above-described embodiment, the two terminal pass-through holes 51 are formed in the partition wall 26, and these two terminal pass-through holes 51 are independent of each other. That is, the above-described embodiment makes it necessary that the sealant 50 is separately injected to the two terminal pass-through holes 51.

In this respect, the variation shown in FIG. 18 adopts a configuration in which the two terminal pass-through holes 51 are in communication with each other via the filling amount checker 54. In this configuration, as shown in FIG. 18(*a*), injecting the sealant 50 into the filling amount checker 54 allows the sealant 50 to be supplied concurrently to the two terminal pass-through holes 51. The variation shown in FIG. 18 can reduce the manufacturing cost as compared with the above-described embodiment, because the sealant 50 is injected only from a single position.

In this variation, as shown in FIG. 18(*b*), an overflow protection wall 53 is formed throughout the entire circumference of an outer edge portion of a region including the two terminal pass-through holes 51 and the filling amount checker 54. This can prevent the sealant from overflowing out of the terminal pass-through holes 51 and the filling amount checker 54.

Although a preferred embodiment of the present invention and a variation thereof have been described above, the above-described configurations can be modified, for example, as follows.

In the above-described embodiment, the tapered surface 77 is provided on the lid part 24 while the contact portion 78 is provided on the casing 8. To the contrary, the tapered surface 77 may be provided on the casing 8 while the contact portion 78 may be provided on the lid part 24.

The burr receiver 76 may be provided in the lid part 24 side.

Although the above-described embodiment adopts the configuration in which the casing 8 and the lid part 24 are welded to each other on the tapered surface 77, the configurations of the burr storage spaces 69, 70 and the burr receiver 76 according to the invention of the present application are also applicable to a case where a casing and a lid part are welded to each other without interposition of the tapered surface 77.

In the above-described embodiment, the board connection terminal 15 is connected to the shunt resistor 7 by welding. This, however, is not limiting, and the configuration according to the invention of the present application is also applicable to the conventional configuration in which the board connection terminal 15 is connected to the shunt resistor 7 by using a mounting screw.

In a case where the configuration according to the invention of the present application is applied to the conventional configuration in which the board connection terminal 15 is mounted by using a mounting screw, it would be necessary that the mounting screw is completely covered with a sealant, in order to ensure a sufficient degree of waterproofness. This requires an increased amount of sealant. In this respect, the embodiment described herein eliminates the conventional mounting screw, and the board connection terminal 15 is mounted by welding. There is no need to cover the mounting screw with the sealant. Thus, the embodiment of the present application provides an advantage that merely a small amount of sealant is required because a sufficient degree of waterproofness can be ensured as long as only the middle portion 31 of the board connection terminal 15 is covered with the sealant.

The positions and the numbers of the anti-rattling pins, the board fixing ribs, and the like, may be changed as appropriate.

DESCRIPTION OF THE REFERENCE NUMERALS

1 battery state detection device
4 battery post terminal
7 shunt resistor
8 casing
9 circuit board
23 board storage space
24 lid part
26 partition wall
50 sealant
51 terminal pass-through hole
56, 57 anti-rattling pin
58, 59 reception hole
67 open mouth
68 welded portion
69 in-casing burr storage space
70 out-of-casing burr storage space
71 first wall surface
72 second wall surface
73 third wall surface
74 fourth wall surface
76 burr receiver

The invention claimed is:
1. A battery state detection device comprising:
a circuit board that detects a current;

a casing with a board storage space formed therein, the board storage space storing the circuit board, the casing including an open mouth through which one side of the board storage space is opened;
a lid part that closes the open mouth of the casing; and
a shunt resistor, wherein
a welded portion is formed along an edge portion of the open mouth, the welded portion being a portion in which the casing and the lid part are connected to each other by welding,
the circuit board detects a current having flowed through the shunt resistor,
the storage space of the casing stores the circuit board,
a plurality of anti-rattling pins is provided in the storage space of the casing, each anti-rattling pin of the plurality of anti-rattling pins includes:
 a tapered portion having a tapered shape, the tapered portion being formed at the distal end of the anti-rattling pin; and
 a plurality of crash ribs each having a rib-like shape starting from a position located at a proximal side relative to the tapered portion and extending in a longitudinal direction of the anti-rattling pin,
each of the plurality of crash ribs has a tapered shape that flares out toward the proximal side of the anti-rattling pin, and
the circuit board has a reception hole that receives the anti-rattling pin.

2. The battery state detection device according to claim 1, wherein
the casing has a first wall surface arranged inside the welded portion,
the lid part has a second wall surface arranged inside the welded portion, the second wall surface being opposed to the first wall surface,
an in-casing burr storage space is provided between the first wall surface and the second wall surface,
the in-casing burr storage space is in communication with the welded portion.

3. The battery state detection device according to claim 2, wherein
the casing or the lid part is provided with a burr receiver that is opposed to an end portion of the in-casing burr storage space.

4. The battery state detection device according to claim 1, wherein
the lid part has a third wall surface arranged outside the welded portion,
the casing has a fourth wall surface arranged outside the welded portion, the fourth wall surface being opposed to the third wall surface,
an out-of-casing burr storage space is provided between the third wall surface and the fourth wall surface,
the out-of-casing burr storage space is in communication with the welded portion.

5. The battery state detection device according to claim 1, wherein
The plurality of anti-rattling pins include a position settlement pin and a rotation restriction pin,
the circuit board has:
 a position settlement hole that receives the position settlement pin; and
 a rotation restriction hole that receives the rotation restriction pin,
the rotation restriction hole is an elongated hole elongated along a straight line connecting the rotation restriction hole to the position settlement hole.

6. The battery state detection device according to claim 1, wherein
a plurality of board fixing ribs are provided on a wall surface of the casing, the plurality of board fixing ribs coming into contact with the circuit board, the contact occurring from the proximal side of an anti-rattling pin from the plurality of anti-rattling pins.

7. The battery state detection device according to claim 6, wherein
an anti-warp rib is provided on the wall surface of the casing, the anti-warp rib being arranged between the board fixing ribs,
with respect to the longitudinal direction of the anti-rattling pin, a distal end portion of the anti-warp rib is positioned closer to the proximal side than a distal end portion of each of the board fixing ribs is.

8. The battery state detection device according to claim 1, comprising a board connection terminal that connects the shunt resistor to the circuit board, wherein
the casing is provided with a partition wall that separates the storage space and the shunt resistor from each other,
the partition wall has a terminal pass-through hole that allows the board connection terminal to pass therethrough,
the terminal pass-through hole is filled with a sealant.

9. The battery state detection device according to claim 8, wherein
a filling amount checker in the form of a recess is provided in the partition wall,
the filling amount checker is in communication with the terminal pass-through hole, the filling amount checker having a depth less than the depth of the terminal pass-through hole.

10. The battery state detection device according to claim 8, wherein
an edge portion of the terminal pass-through hole has a beveled contour.

11. A method for manufacturing a battery state detection device, the battery state detection device comprising:
a circuit board that detects a current;
a casing with a board storage space formed therein, the board storage space storing the circuit board, the casing including an open mouth through which one side of the board storage space is opened;
a lid part that closes the open mouth of the casing; and
a shunt resistor,
the method including a welding step of performing ultrasonic welding between the casing and the lid part in a state where a tapered surface provided in one of the casing and the lid part is in contact with a contact portion provided in the other of the casing and the lid part, the contact portion being brought into contact with the tapered surface, wherein
in the welding step, the ultrasonic welding is performed with an anti-deformation jig arranged along an outer peripheral wall surface of the casing, and wherein
the circuit board detects a current having flowed through the shunt resistor,
the storage space of the casing stores the circuit board,
a plurality of anti-rattling pins is provided in the storage space of the casing, each anti-rattling pin of the plurality of anti-rattling pins includes:
 a tapered portion having a tapered shape, the tapered portion being formed at the distal end of the anti-rattling pin; and
 a plurality of crash ribs each having a rib-like shape starting from a position located at a proximal side relative to the tapered portion and extending in a longitudinal direction of the anti-rattling pin, each of the plurality of crash ribs has a tapered shape that flares out toward the proximal side of the anti-rattling pin, and the circuit board has a reception hole that receives the anti-rattling pin.

12. The method for manufacturing a battery state detection device according to claim 11, wherein the contact portion is provided in the casing, the casing has a first wall surface facing inward, the first wall surface being arranged inside the contact portion, the tapered surface is provided in the lid part, the lid part has a second wall surface facing outward, the second wall surface being arranged inside the tapered surface, in the welding step, a predetermined gap is formed between the first wall surface and the second wall surface in the state where the tapered surface and the contact portion are in contact with each other.

\* \* \* \* \*